(12) United States Patent
Wengreen

(10) Patent No.: US 10,117,344 B2
(45) Date of Patent: Oct. 30, 2018

(54) MOUNTING SYSTEMS FOR MEDIA PLAYERS

(71) Applicant: Innovelis, Inc., Sammamish, WA (US)

(72) Inventor: Eric John Wengreen, Sammamish, WA (US)

(73) Assignee: Innovelis, Inc., Sammamish, WA (US)

(*) Notice: Subject to any disclaimer, the term of this patent is extended or adjusted under 35 U.S.C. 154(b) by 0 days.

(21) Appl. No.: 15/481,406

(22) Filed: Apr. 6, 2017

(65) Prior Publication Data
US 2017/0208945 A1 Jul. 27, 2017

Related U.S. Application Data

(63) Continuation-in-part of application No. 12/424,837, filed on Feb. 4, 2017, and a continuation-in-part of application No. 29/593,756, filed on Feb. 13, 2017, now Pat. No. Des. 806,521, and a continuation-in-part of application No. 29/593,759, filed on Feb. 13, 2017, now Pat. No. Des. 803,030, and a continuation-in-part of application No. 29/593,760, filed on Feb. 13, 2017, now Pat. No. Des. 808,367, and a continuation-in-part of application No. 29/594,460, filed on Feb. 17, 2017, now Pat. No. Des. 804,289, and a continuation-in-part of application No. 29/597,495, filed on Mar. 17, 2017, now Pat. No. Des. 812,064, and a
(Continued)

(51) Int. Cl.
H05K 5/02 (2006.01)
A47B 81/06 (2006.01)
A47B 96/02 (2006.01)
F16M 13/02 (2006.01)
H05K 7/20 (2006.01)
A47B 97/00 (2006.01)

(52) U.S. Cl.
CPC ........... *H05K 5/0204* (2013.01); *A47B 81/06* (2013.01); *A47B 96/027* (2013.01); *F16M 13/02* (2013.01); *H05K 7/20127* (2013.01); *A47B 97/001* (2013.01)

(58) Field of Classification Search
CPC ... A47B 95/008; A47B 841/06; A47B 96/027; A47B 97/001; H05K 5/0204; H05K 5/0213; H05K 7/14; H05K 7/20127; F16M 13/02; F16M 13/022; F16M 11/041
See application file for complete search history.

(56) References Cited

U.S. PATENT DOCUMENTS 1,618,573 A 2/1927 Cole
2,584,646 A 2/1952 Wagstaff
(Continued)

OTHER PUBLICATIONS

Level Mount Installation Manual—Copyright 2012—Downloaded on Oct. 10, 2017 from https://levelmount.com/Pdf/Instructions/Large-Extra%20Large%20Fixed-Tilt%20Mounts.pdf.

*Primary Examiner* — Patrick D Hawn

(57) ABSTRACT

Shelf systems can be configured to couple an electronic device to a wall. In some embodiments, shelf systems include a base having a backside configured to face inward towards the wall and a frontside configured to face outward away from the wall. Shelf systems can also include a first sidewall and a second sidewall that are coupled to the base, protrude away from the wall, and help secure the electronic device to the base. In several embodiments, a level is configured to indicate a horizontal condition of the shelf.

20 Claims, 19 Drawing Sheets

Related U.S. Application Data continuation-in-part of application No. 29/597,508, filed on Mar. 17, 2017, now Pat. No. Des. 813,241.

(56) References Cited

U.S. PATENT DOCUMENTS

| | | | |
|---|---|---|---|
| 3,091,378 A | 5/1963 | O'Dwyer | |
| D196,542 S | 10/1963 | Zelnick | |
| 3,176,950 A | 4/1965 | Hittesdorf | |
| 3,279,009 A | 10/1966 | Teasdale | |
| 3,294,298 A | 12/1966 | Danielson | |
| 3,311,435 A * | 3/1967 | Heritage | A47B 95/008 108/152 |
| 3,477,679 A | 11/1969 | Lovitz | |
| 3,990,617 A | 11/1976 | Carter | |
| D242,766 S | 12/1976 | Neece | |
| 4,067,532 A | 1/1978 | Viteretto | |
| 4,158,450 A | 6/1979 | Suzuki | |
| 4,467,244 A | 8/1984 | Dickie | |
| 4,519,656 A | 5/1985 | Raz | |
| D280,466 S | 9/1985 | Seltzer | |
| D282,034 S | 1/1986 | Janke | |
| 4,602,761 A | 7/1986 | Carter | |
| 4,697,780 A | 10/1987 | Wenkman | |
| 4,746,042 A | 5/1988 | King | |
| 4,771,927 A | 9/1988 | Ventura | |
| 4,815,683 A | 3/1989 | Ferrante | |
| 4,825,590 A | 5/1989 | Cullinane | |
| 4,826,115 A | 5/1989 | Novitski | |
| 4,840,773 A | 6/1989 | Wade | |
| 4,852,843 A | 8/1989 | Chandler | |
| 4,974,764 A | 12/1990 | Cantwell | |
| D317,157 S | 5/1991 | Jondelius | |
| 5,038,985 A | 8/1991 | Chapin | |
| 5,092,395 A | 3/1992 | Amidzich | |
| D329,192 S * | 9/1992 | Susac | D8/349 |
| 5,160,126 A * | 11/1992 | Atkinson | A47B 95/008 269/102 |
| 5,227,582 A | 7/1993 | Velasco | |
| 5,273,690 A | 12/1993 | McDowell | |
| 5,297,318 A | 3/1994 | Adolphson | |
| D351,341 S | 10/1994 | Hung | |
| 5,375,749 A * | 12/1994 | Oliva | A45F 5/02 224/242 |
| 5,385,282 A | 1/1995 | Chen | |
| 5,400,990 A | 3/1995 | Frankel | |
| D359,616 S | 6/1995 | Ishibashi | |
| D361,335 S | 8/1995 | Rudkiewicz | |
| D361,462 S | 8/1995 | Newham | |
| D369,465 S | 5/1996 | Scheid | |
| 5,535,093 A | 7/1996 | Noguchi | |
| D376,787 S | 12/1996 | Calfee | |
| 5,593,124 A | 1/1997 | Wang | |
| 5,619,395 A | 4/1997 | McBride | |
| 5,619,774 A | 4/1997 | Perry | |
| D388,107 S | 12/1997 | Huckins | |
| D390,849 S | 2/1998 | Richter | |
| 5,850,996 A * | 12/1998 | Liang | A45F 5/02 248/221.11 |
| 5,850,998 A | 12/1998 | Parsey | |
| D407,408 S | 3/1999 | Hoff | |
| D409,079 S | 5/1999 | Sobczynski | |
| 5,899,371 A | 5/1999 | Weliver | |
| D411,542 S | 6/1999 | Richter | |
| 5,914,707 A | 6/1999 | Kono | |
| 5,961,083 A | 10/1999 | Hartman | |
| 5,979,724 A | 11/1999 | Loewenthal | |
| D420,149 S | 2/2000 | Hersh | |
| 6,039,173 A | 3/2000 | Crow | |
| D425,353 S | 5/2000 | Foy | |
| 6,073,901 A | 6/2000 | Richter | |
| 6,102,660 A | 8/2000 | Lee | |
| 6,105,923 A | 8/2000 | Robertson | |
| D431,250 S | 9/2000 | Richter | |
| 6,163,997 A | 12/2000 | Deralas | |
| 6,193,546 B1 | 2/2001 | Sadler | |
| D443,493 S | 6/2001 | Skeem | |
| 6,275,885 B1 | 8/2001 | Chin | |
| D451,915 S * | 12/2001 | Dalmau | D14/253 |
| 6,336,615 B1 | 1/2002 | Jeon | |
| D456,024 S | 4/2002 | Richter | |
| D456,413 S | 4/2002 | Malson | |
| 6,445,290 B1 | 9/2002 | Fingal | |
| 6,485,144 B1 | 11/2002 | Liao | |
| D471,547 S | 3/2003 | Ruohonen | |
| 6,554,527 B1 | 4/2003 | O'Donnell | |
| 6,560,983 B1 | 5/2003 | Schimmeyer | |
| 6,691,374 B2 | 2/2004 | Coyne | |
| 6,877,641 B2 * | 4/2005 | Howland | F16M 13/02 222/180 |
| 6,888,940 B1 | 5/2005 | Deppen | |
| D508,605 S | 8/2005 | Shih-Ming | |
| 6,939,641 B2 | 9/2005 | Kincaid | |
| 6,983,126 B1 | 1/2006 | Saalman | |
| D518,704 S | 4/2006 | Miao | |
| 7,047,601 B1 | 5/2006 | Vernon-Woods | |
| 7,067,737 B2 | 6/2006 | Mallen | |
| 7,079,384 B2 | 7/2006 | Wang | |
| 7,080,764 B2 | 7/2006 | McNicholas | |
| 7,113,218 B2 | 9/2006 | Battles | |
| D529,713 S | 10/2006 | Guyot | |
| D529,905 S | 10/2006 | Richter | |
| D530,713 S | 10/2006 | Richter | |
| D533,175 S | 12/2006 | Richter | |
| 7,145,603 B2 | 12/2006 | Whitby | |
| D535,826 S | 1/2007 | Toghanian | |
| D536,239 S | 2/2007 | Tallman | |
| 7,222,762 B2 | 5/2007 | Rees | |
| D545,343 S | 6/2007 | Braun | |
| D547,863 S | 7/2007 | Heinsch | |
| 7,261,264 B2 * | 8/2007 | Moran | A01K 1/0356 24/573.11 |
| D551,008 S | 9/2007 | Hidalgo | |
| D553,352 S | 10/2007 | Allen | |
| D557,266 S | 12/2007 | Hughes | |
| D560,411 S | 1/2008 | Chung | |
| D564,529 S | 3/2008 | Hughes | |
| D565,399 S | 4/2008 | Grey | |
| D568,889 S | 5/2008 | Hughes | |
| 7,367,089 B2 | 5/2008 | Cooke | |
| D570,801 S | 6/2008 | Allen | |
| D586,795 S | 2/2009 | Richter | |
| D596,172 S | 7/2009 | Ahlqvist | |
| D598,945 S | 8/2009 | Gillespie | |
| 7,580,255 B2 | 8/2009 | Crooijmans | |
| D601,000 S | 9/2009 | Cole | |
| D609,030 S | 2/2010 | Barabas | |
| D610,579 S | 2/2010 | Behar | |
| 7,802,769 B1 * | 9/2010 | Lindsey | A47G 1/205 248/475.1 |
| D624,949 S | 10/2010 | Nakayama | |
| D625,729 S | 10/2010 | McNames | |
| D628,611 S | 12/2010 | Lewis | |
| 7,854,420 B2 | 12/2010 | Depay | |
| D633,503 S | 3/2011 | Bo | |
| 7,959,121 B1 | 6/2011 | Barnes | |
| 7,980,435 B2 | 7/2011 | Tages | |
| 8,016,107 B2 * | 9/2011 | Emsky | A45C 11/00 206/320 |
| 8,020,821 B2 * | 9/2011 | Chen | F16M 13/02 248/220.22 |
| D648,727 S | 11/2011 | Van Den Nieuwenhuizen | |
| D657,362 S | 4/2012 | Lister | |
| D662,491 S | 6/2012 | Andre | |
| D667,411 S | 9/2012 | Kim | |
| D669,890 S | 10/2012 | Hopkins | |
| 8,282,058 B2 * | 10/2012 | Lundrigan | F16M 11/046 248/220.22 |
| D672,308 S | 12/2012 | Cobbett | |
| 8,322,584 B2 | 12/2012 | Dethmers | |
| D686,629 S | 7/2013 | Trinh | |
| D690,707 S | 10/2013 | Minn | |
| 8,544,805 B2 | 10/2013 | Virgin | |
| D695,748 S | 12/2013 | Morris | |

(56) References Cited

U.S. PATENT DOCUMENTS

| | | | |
|---|---|---|---|
| D700,832 S | 3/2014 | Ng | |
| D705,229 S | 5/2014 | Wengreen | |
| D710,340 S | 8/2014 | Wengreen | |
| D710,363 S | 8/2014 | Wengreen | |
| D710,836 S | 8/2014 | Wengreen | |
| D712,906 S | 9/2014 | Wengreen | |
| D713,395 S | 9/2014 | Godycki | |
| D713,399 S | 9/2014 | Green | |
| D713,835 S * | 9/2014 | Sirichai | D14/253 |
| 8,847,549 B2 | 9/2014 | Graham | |
| 8,848,113 B2 | 9/2014 | Wengreen | |
| D714,793 S | 10/2014 | Kim | |
| D716,580 S | 11/2014 | Wengreen | |
| D717,307 S | 11/2014 | Chun | |
| D717,804 S | 11/2014 | Budge | |
| 8,896,768 B1 | 11/2014 | Wengreen | |
| 8,934,060 B1 | 1/2015 | Wengreen | |
| 8,934,061 B1 | 1/2015 | Wengreen | |
| 8,939,417 B1 | 1/2015 | Wengreen | |
| D723,042 S | 2/2015 | Lee | |
| 8,988,616 B2 | 3/2015 | Wengreen | |
| D729,544 S | 5/2015 | Wengreen | |
| D732,939 S | 6/2015 | Cannaverde | |
| D733,105 S | 6/2015 | Wengreen | |
| D733,542 S | 7/2015 | Cannaverde | |
| D733,691 S | 7/2015 | Wengreen | |
| D734,305 S | 7/2015 | Wengreen | |
| D735,174 S | 7/2015 | Wengreen | |
| D739,410 S | 9/2015 | Chun | |
| 9,131,195 B2 | 9/2015 | Wengreen | |
| 9,163,779 B2 * | 10/2015 | Funk | F16M 13/02 |
| D742,387 S | 11/2015 | Xiang | |
| 9,185,953 B2 | 11/2015 | Whitten | |
| D746,599 S | 1/2016 | Olson | |
| D749,549 S | 2/2016 | Wengreen | |
| D749,597 S | 2/2016 | Wengreen | |
| D750,633 S | 3/2016 | Minn | |
| D751,563 S | 3/2016 | Wengreen | |
| D752,415 S | 3/2016 | Lu | |
| 9,339,112 B2 | 5/2016 | Wengreen | |
| D759,005 S | 6/2016 | Murakami | |
| D761,236 S | 7/2016 | Wengreen | |
| D763,666 S | 8/2016 | Wengreen | |
| D763,835 S | 8/2016 | Wengreen | |
| D765,063 S | 8/2016 | Wengreen | |
| D765,064 S | 8/2016 | Wengreen | |
| 9,404,615 B1 * | 8/2016 | Gonzalez | F16M 11/04 |
| D765,646 S | 9/2016 | Deng | |
| D765,651 S | 9/2016 | Liu | |
| D767,377 S | 9/2016 | Sekula | |
| D770,171 S | 11/2016 | Lai | |
| D772,217 S | 11/2016 | Alesi | |
| D772,859 S * | 11/2016 | Alesi | D14/253 |
| D777,167 S | 1/2017 | Wengreen | |
| 9,543,082 B1 | 1/2017 | Wengreen | |
| D779,466 S | 2/2017 | Wengreen | |
| 9,578,960 B1 | 2/2017 | Kuan-Yen | |
| D795,820 S | 8/2017 | Wengreen | |
| D798,305 S * | 9/2017 | Wengreen | D14/447 |
| D798,306 S * | 9/2017 | Wengreen | D14/447 |
| D804,289 S * | 12/2017 | Wengreen | D8/354 |
| D806,521 S * | 1/2018 | Wengreen | D8/354 |
| D808,367 S * | 1/2018 | Wengreen | D14/238.1 |
| D812,064 S * | 3/2018 | Wengreen | D14/434 |
| D813,241 S * | 3/2018 | Wengreen | D14/434 |
| 2002/0079864 A1* | 6/2002 | Soumi | H02J 7/0044 320/115 |
| 2005/0023419 A1 | 2/2005 | Frankel | |
| 2005/0211861 A1 | 9/2005 | Lee | |
| 2005/0236541 A1 | 10/2005 | Chang | |
| 2006/0186290 A1* | 8/2006 | Carnevali | E05B 65/006 248/221.11 |
| 2006/0224575 A1 | 10/2006 | Ostojic | |
| 2007/0097617 A1 | 5/2007 | Searby | |
| 2007/0235609 A1 | 10/2007 | Chun | |
| 2007/0264169 A1 | 11/2007 | Chen | |
| 2008/0067298 A1* | 3/2008 | Mossman | F16M 11/10 248/125.9 |
| 2008/0078793 A1 | 4/2008 | Brown | |
| 2008/0149796 A1* | 6/2008 | Moscovitch | B60R 11/0235 248/309.1 |
| 2009/0218454 A1 | 9/2009 | Stanley | |
| 2009/0230161 A1* | 9/2009 | Emsky | A45C 11/00 224/257 |
| 2009/0296997 A1 | 12/2009 | Rocheford | |
| 2010/0193658 A1* | 8/2010 | Beger | F16M 11/126 248/542 |
| 2010/0270190 A1 | 10/2010 | Howard | |
| 2010/0281671 A1 | 11/2010 | De Vaan | |
| 2010/0288895 A1 | 11/2010 | Shamie | |
| 2010/0314277 A1 | 12/2010 | Murray | |
| 2011/0000945 A1* | 1/2011 | Mongan | A45F 5/02 224/581 |
| 2011/0242439 A1 | 10/2011 | Calderon | |
| 2012/0025035 A1* | 2/2012 | Huang | F16M 11/041 248/122.1 |
| 2012/0126081 A1 | 5/2012 | Wengreen | |
| 2012/0127379 A1 | 5/2012 | Wengreen | |
| 2012/0168516 A1 | 7/2012 | Bolger | |
| 2012/0280014 A1 | 11/2012 | Lopez-Apodaca | |
| 2012/0312950 A1 | 12/2012 | Sears | |
| 2013/0032617 A1* | 2/2013 | Adelman | A45F 5/00 224/191 |
| 2013/0092811 A1* | 4/2013 | Funk | F16M 13/02 248/371 |
| 2014/0061406 A1 | 3/2014 | Chevalier | |
| 2014/0103179 A1 | 4/2014 | Lipke | |
| 2014/0147093 A1* | 5/2014 | Wengreen | H05K 5/0204 386/230 |
| 2014/0241705 A1 | 8/2014 | Wengreen | |
| 2015/0070835 A1 | 3/2015 | McLean | |
| 2015/0184796 A1* | 7/2015 | Wengreen | F16M 13/02 248/222.41 |
| 2015/0212544 A1 | 7/2015 | Chen | |
| 2015/0305502 A1 | 10/2015 | Wengreen | |
| 2016/0007735 A1 | 1/2016 | Gallup | |
| 2016/0119458 A1 | 4/2016 | Gunther | |
| 2016/0120295 A1 | 5/2016 | Rowley | |
| 2016/0218535 A1 | 7/2016 | Prete | |
| 2016/0234955 A1 | 8/2016 | Wengreen | |
| 2016/0241289 A1 | 8/2016 | Wieth | |
| 2017/0150620 A1 | 5/2017 | Wengreen | |
| 2017/0208945 A1 | 7/2017 | Wengreen | |

* cited by examiner

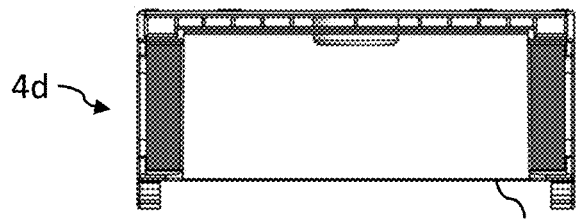
Figure 27
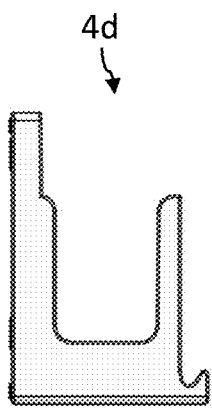
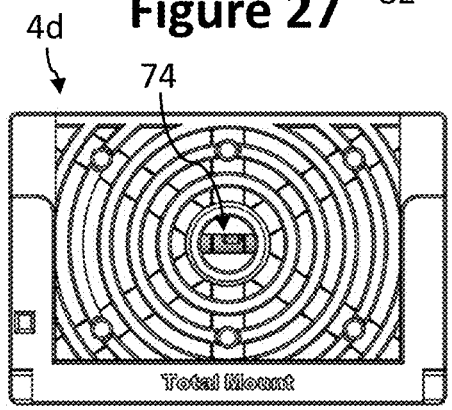
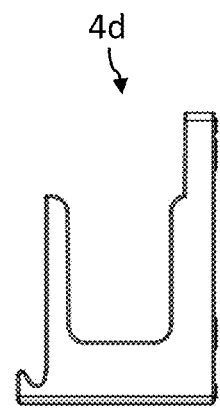
Figure 28  Figure 29  Figure 30
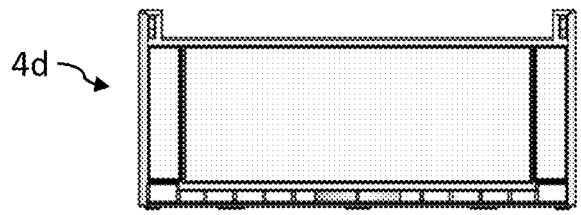
Figure 31
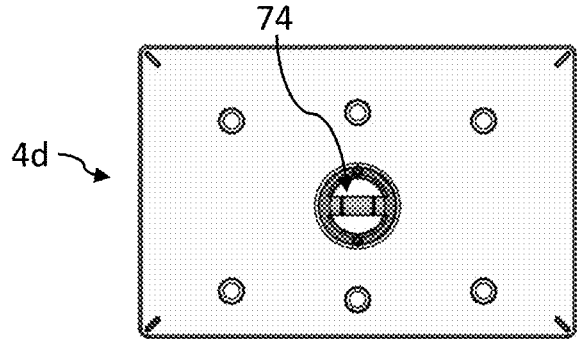
Figure 32

MOUNTING SYSTEMS FOR MEDIA PLAYERS

CROSS-REFERENCE TO RELATED APPLICATIONS

The entire contents of the following application are incorporated by reference herein: U.S. patent application Ser. No. 15/424,837; filed Feb. 4, 2017; and entitled MOUNTING SYSTEMS FOR MEDIA PLAYERS.

The entire contents of the following application are incorporated by reference herein: U.S. patent application Ser. No. 29/593,756; filed Feb. 13, 2017; and entitled MOUNT FOR ELECTRONIC DEVICES.

The entire contents of the following application are incorporated by reference herein: U.S. patent application Ser. No. 29/593,759; filed Feb. 13, 2017; and entitled MOUNT FOR ELECTRONIC DEVICES.

The entire contents of the following application are incorporated by reference herein: U.S. patent application Ser. No. 29/593,760; filed Feb. 13, 2017; and entitled MOUNT FOR ELECTRONIC DEVICES.

The entire contents of the following application are incorporated by reference herein: U.S. patent application Ser. No. 29/594,460; filed Feb. 17, 2017; and entitled MOUNT FOR ELECTRONIC DEVICES.

The entire contents of the following application are incorporated by reference herein: U.S. patent application Ser. No. 29/597,495; filed Mar. 17, 2017; and entitled MOUNT FOR ELECTRONIC DEVICES.

The entire contents of the following application are incorporated by reference herein: U.S. patent application Ser. No. 29/597,508; filed Mar. 17, 2017; and entitled MOUNT FOR ELECTRONIC DEVICES.

BACKGROUND

Field

Various embodiments disclosed herein relate to mounting systems and mounting methods. Certain embodiments relate to mounting systems configured to couple electronic devices to a wall.

Description of Related Art

Electronic devices can be electronically and even physically coupled to other electronic devices. For example, a digital media player can be coupled to a television by a High-Definition Multimedia Interface (HDMI) cable to enable the television to display media, such as movies or games, from the digital media player. The digital media player can receive media from data storage devices (such as discs or internal hard drives) or from the Internet through many different content providers such as Netflix Inc., Microsoft Corporation, and Sony Corporation.

Mounting systems can be used to couple electronic devices to a wall. Mounting systems can hold electronic devices while the electronic devices provide media from the Internet and/or from data storage devices to televisions. Electronic devices can be damaged if they fall out of mounting systems. Thus, there is a need for systems and methods to securely mount electronic devices to diverse types of walls and surfaces.

SUMMARY

Shelf systems can be used to couple electronic devices to a wall, such as a wall of a building or a wall of a television.

In some embodiments, a shelf system is configured to couple an electronic device to a wall. Shelf systems can comprise a base having a backside configured to face inward towards the wall and a frontside configured to face outward away from the wall; a shelf coupled to the base, wherein the shelf protrudes outward from the base such that the shelf is configured to be oriented within 15 degrees of perpendicular to the wall; a first sidewall coupled to a left half of the base and a second sidewall coupled to a right half of the base; and/or a level coupled to the base, wherein the level is configured to indicate a horizontal condition of the shelf.

In several embodiments, a level comprises a first horizontal orientation and the shelf comprises a second horizontal orientation that is within five degrees of the first horizontal orientation. The shelf system can comprise the electronic device located at least partially between the first sidewall, the second sidewall, and the shelf such that the shelf is configured to vertically support the electronic device in a third horizontal orientation that is within five degrees of the first horizontal orientation.

In some embodiments, the shelf system comprises a first retention lip coupled to the first sidewall and a second retention lip coupled to the second sidewall. A central axis of the level is oriented between the first and second sidewalls such that the electronic device is prevented from moving left by the first sidewall, right by the second sidewall, outward by the first and second retention lips, and downward by the shelf. The shelf can couple the first sidewall to the second sidewall. The first and second sidewalls can be oriented within five degrees of perpendicular to a central axis of the level.

In several embodiments, the shelf comprises a first vertical protrusion coupled to a left half of an outward half of the shelf, and the shelf comprises a second vertical protrusion coupled a right half of the outward half. The first and second vertical protrusions can be oriented within ten degrees of perpendicular to a central axis of the level such that the electronic device is located inward relative to the first and second vertical protrusions and the electronic device is located outward relative to the level.

In some embodiments, the base comprises an outward-facing wall that couples the first and second sidewalls to the backside, and the level comprises a central axis that is located inward relative to the outward-facing wall. The first sidewall, the second sidewall, and the shelf can be located outward relative to the central axis of the level. The shelf system can be configured to secure at least a portion of the electronic device between the outward-facing wall, the first sidewall, the second sidewall, and the shelf.

In some embodiments, the shelf system does not comprise the electronic device. In some embodiments, the shelf system comprises the electronic device. The first sidewall can couple a first retention lip to the base. The retention lips can have at least one inward facing surface configured to block the electronic device from moving outward off the shelf. The second sidewall can couple a second retention lip to the base. A central axis of the level can be oriented from the left half of the base (which can be coupled to the first sidewall) to the right half of the base (which can be coupled to the second sidewall) such that at least a portion, at least a majority, or all of the electronic device is located between the level, the first sidewall, the second sidewall, the first retention lip, the second retention lip, and the shelf.

In several embodiments, the level comprises a hollow tube that is at least partially filled with a liquid and a gas bubble. The tube can comprise a central axis located farther inward than a first intersection (e.g., an outermost intersection) between the first sidewall and the base. The central axis can be located farther inward than a second intersection between the second sidewall and the base. The level can be at least partially recessed within a hole of the base to prevent the level from interfering with inserting the electronic device onto the shelf.

In some embodiments, the base comprises a first hole having a perimeter. The level can be located at least partially in the first hole. The level can be at least partially supported by the perimeter of the first hole. The base can comprise ventilation channels formed by intersecting protrusions. The intersecting protrusions can couple the first hole to the left half and the right half of the base.

In several embodiments, the level comprises a left end portion and a right end portion that are secured within a housing. The base can comprise ventilation channels formed by protrusions that couple the housing to the base. In some embodiments, at least one of the protrusions comprises a first hole configured to enable a first screw to pass through the protrusion to screw the base to the wall. The housing can comprise a second hole located between the left end portion and the right end portion of the level such that a middle portion of the level is visible through the second hole when the base is coupled to the wall.

In some embodiments, the level comprises a left end portion and a right end portion that are secured within a housing. A first protrusion can couple the housing to the left half of the base. A second protrusion can couple the housing to the right half of the base. Intersecting braces can couple the first protrusion to the second protrusion.

In several embodiments, the base comprises a ventilation channel from a bottom end portion of the base to a top end portion of the base. The ventilation channel can be a hollow portion of the base. In some embodiments, the ventilation channel is formed when the base is coupled to the wall. For example, a wall of the base and the wall of the building can form a hollow area fluidly coupled to openings in the top and bottom of the system.

In some embodiments, the base further comprises at least two holes formed, at least in part, by the first protrusion, the second protrusion, and the intersecting brace. The holes can be fluidly coupled with the ventilation channel such that the holes are configured to permit airflow from an area (that is configured to hold the electronic device) between the first and second sidewalls into the ventilation channel.

In several embodiments, the level comprises a left end portion and a right end portion that are secured within a housing. The housing can comprise a hole located between the left end portion and the right end portion of the level such that a middle portion of the level is visible through the hole. The housing can comprise a channel that faces inward and wraps around the level. The shelf system can comprise a ring located at least partially inside the channel such that the level is secured between the housing and the ring.

In some embodiments, the level comprises a hollow tube at least partially filled with a liquid and a gas bubble. The gas bubble can be configured to move inside the hollow tube to indicate the horizontal condition of the shelf. For example, if the bubble is located to the right of the center of the tube, then the right side of the tube may be higher than the left side of the tube.

In several embodiments, the level comprises a hollow tube and a weight (e.g., a ball) located inside the tube. The weight (e.g., a ball) can be configured to move inside the hollow tube to indicate the horizontal condition of the shelf.

For example, if the weight is located to the right of the center of the tube, then the right side of the tube may be lower than the left side of the tube.

In some embodiments, the level comprises a weight rotatably coupled to the base by an attachment point. The weight can be configured to hang below the attachment point and rotate relative to the attachment point to indicate the horizontal condition of the shelf. The level can be a plumb bob (e.g., a weight suspended by a string). The level can be an arm coupled to the base by a pivot such that the arm points downward (as moved by gravity). Many types of levels can be used with the embodiments described herein.

Mounting systems can be used to couple electronic devices to a wall, such as a wall of a building or a wall of a television.

In some embodiments, a mounting system is configured to couple an electronic device to a wall. The mounting system can comprise a base having a backside configured to face inward towards the wall and a frontside configured to face outward away from the wall. The mounting system can comprise a first sidewall and a second sidewall that are coupled to the base, are configured to protrude away from the wall, and are configured to secure the electronic device to the base. The mounting system can comprise a first protrusion, a second protrusion, a third protrusion, and a fourth protrusion coupled to the base and configured to push the electronic device outward away from the wall. As used herein, "push" does not necessarily mean move but means to press against with force.

In several embodiments, the base comprises a hole. The first protrusion can be spring-loaded outward from the hole. The first protrusion can be configured such that pressing the first protrusion inward moves at least a second portion of the first protrusion inward through the hole of the base. Moving at least a second portion of the first protrusion inward through the hole can be accomplished by moving the first protrusion part way through the hole and does not necessarily mean moving an object all the way through the hole. The hole can be a "through hole" or can be a hole with a closed bottom (such as a valley). In some embodiments, the hole is much wider than it is deep. Thus, holes can be very shallow.

Embodiments can use any type of spring. For example, embodiments can use cantilever springs, coil springs, tension springs, extension springs, torsion springs, constant springs, variable springs, flat springs, machined springs, serpentine springs, helical springs, volute springs, hairsprings, balance springs, leaf springs, V-springs, Belleville springs, gas springs, mainsprings, negator springs, progressive rate coil springs, rubber bands, spring washers, torsion springs, and/or wave springs. Springs can be made from any suitable material including molded plastic, elastic materials, and/or spring steel.

In several embodiments, the base comprises a hole configured to enable the first protrusion to move inward through the hole (e.g., as the first protrusion is pressed inward in response to inserting the electronic device into the mount). At least a first portion of the first protrusion can be anchored to a side of the hole. As used herein, anchor means to hold in place. An anchor can be a rigid connection. In some embodiments, anchors are not rigid connections but instead are features that block unwanted movement. For example, an anchor can be an outer wall that prevents the first protrusion from moving too far outward while still permitting the first protrusion to move inward in response to inserting the electronic device.

In some embodiments, at least a portion of the first protrusion is located between the first and second sidewalls. A spring can couple the protrusion to the base such that coupling the electronic device to the base by placing the electronic device at least partially between the first and second sidewalls presses the protrusion inward by overcoming a resistance force of the spring. The spring can be any type of spring including a cantilever spring and a coil spring.

In several embodiments, the first protrusion comprises a cantilever beam having a first portion anchored to the base and a second portion configured to bend inward in response to coupling the electronic device to the base by placing the electronic device at least partially between the first and second sidewalls.

In some embodiments, the first portion is located farther inward than the second portion such that (A) the first portion is not configured to collide with the electronic device as the electronic device is coupled to the mounting system and (B) the second portion is configured to collide with the electronic device as the electronic device is coupled to the mounting system.

In some embodiments, the cantilever beam is curved such that the first portion is located further inward than the second portion. The cantilever beam can comprise a first section and a second section. The first section can be oriented at a greater angle relative to the base than the second section is oriented relative to the base. (The outer-facing wall of the base can define the orientation of the base.) The angle of the first section can facilitate a gradual transition as the electronic device is inserted into the mount such that pressing the cantilever beam inward does not require a large electronic device insertion force.

In several embodiments, the base comprises a hole. The cantilever beam can be located at least partially inside the hole such that the second portion of the cantilever beam is configured to bend inward at least partially through the hole in response to coupling the electronic device to the base.

In some embodiments, the first portion is anchored to the base inside the hole of the base. The second portion can be located outward relative to the hole such that the second portion is configured to collide with the electronic device as the electronic device is coupled to the mounting system.

In several embodiments, a rubber layer is coupled to an outward facing surface of the cantilever beam. The system can comprise the electronic device coupled at least partially between the first and second sidewalls such that at least a portion of the rubber layer is compressed between the electronic device and the cantilever beam. The base and sidewalls (and other parts of the mount) can be made from a first material. The first material can be molded plastic. The rubber layer can be made from a second material that is softer than the first material.

In some embodiments, the system is configured to enable inserting the electronic device into the system in a first direction. The first protrusion can comprise a cantilever beam having an anchored end and a distal end configured to move relative to the anchored end. The cantilever beam comprises an orientation defined from the anchored end to the distal end. The orientation can be within plus or minus 30 degrees of parallel to or perpendicular to the first direction.

In several embodiments, the base can comprise a hole. The cantilever beam can be located at least partially in the hole. The cantilever beam can be curved outward. The cantilever beam can be configured to move at least partially inward through the hole in response to coupling the electronic device to the base.

In some embodiments, the base comprises a first side coupled to the first sidewall, a second side located opposite the first side and coupled to the second sidewall, a third side having a third sidewall oriented within plus or minus 20 degrees of perpendicular to the first and second sidewalls, and a fourth side located opposite the third side and configured to enable inserting the electronic device at least partially into the mounting system between the first and second sidewalls. The first protrusion can have an outermost portion located between the first and second sidewalls. The outermost portion can be coupled to the base by a spring such that a neutral position of the outermost portion is located in an insertion path of the electronic device such that inserting the electronic device pushes the outermost portion inward while the outermost portion applies an outward force on the electronic device. The first sidewall and the second sidewall can be configured to resist the outward force of the first protrusion.

In several embodiments, the first protrusion protrudes towards the fourth side. In some embodiments, the first protrusion protrudes away from the fourth side. As used herein, the first protrusion can protrude toward the fourth side without protruding directly towards the fourth side. As used herein, the first protrusion can protrude away from the fourth side without protruding directly away from the fourth side. "Toward" is used broadly to mean in the direction of an object and does not require pointing exactly at an object. For example, protruding towards a side can be accomplished by protruding in a direction that makes the distal end of the protrusion closer to the side.

In some embodiments, the mounting system comprises a fourth sidewall located opposite the third sidewall and coupled to the base by a flex arm configured to bend to enable the fourth sidewall to move inward out of the insertion path of the electronic device. This fourth sidewall can be much smaller than other sidewalls.

In some embodiments, an electronic device is located at least partially between the first and second sidewalls. The first protrusion can be spring-loaded outward towards a first inward-facing wall of the electronic device such that the first inward-facing wall of the electronic device presses the first protrusion inward.

In several embodiments, the electronic device is located at least partially between an outward-facing wall of the base and a second inward facing wall coupled to the base by the first sidewall. The first protrusion can be coupled to the base by a second protrusion located farther inward than the outward-facing wall of the base. The first protrusion can be located farther outward than the outward-facing wall of the base.

Any of the systems described herein can be used with any of the methods described herein. Any of the methods described herein can be used with any of the systems described herein. Each of the system embodiments can be used as method embodiments.

In some embodiments, methods comprise coupling an electronic device to a wall (e.g., a wall of a building, a wall of a television). Embodiments can comprise obtaining a mounting system comprising a base having a backside facing inward towards the wall and a frontside facing outward away from the wall; a first sidewall and a second sidewall that are coupled to the base, protrude away from the wall, and secure the electronic device to the base; and a first protrusion coupled to the base and configured to push the electronic device outward away from the wall.

Methods can comprise coupling the mounting system to the wall. Methods can comprise overcoming a spring force of the first protrusion to move the first protrusion inward towards the wall by inserting at least a portion of the electronic device between the first and second sidewalls such that the first protrusion presses the electronic device outward while the first and second sidewalls block the electronic device from moving outward.

In several embodiments, the first protrusion comprises a cantilever beam having a first portion anchored to the base and a second portion coupled to the first portion. Embodiments can comprise bending the second portion inward in response to coupling the electronic device to the base.

In some embodiments, the first protrusion is spring-loaded outward from a hole. Embodiments can comprise pressing the first protrusion inward (such that the first protrusion moves at least a first portion of the first protrusion inward through the hole) by inserting the electronic device into the mount such that at least a portion of the electronic device is located between the first and second sidewalls. A spring can be located between the first protrusion and an inward side of the base such that the spring is configured to press the first protrusion outward into the insertion path of the electronic device.

BRIEF DESCRIPTION OF THE DRAWINGS

These and other features, aspects, and advantages are described below with reference to the drawings, which are intended to illustrate, but not to limit, the invention. In the drawings, like reference characters denote corresponding features consistently throughout similar embodiments.

FIG. 27 illustrates a top view of the mounting system illustrated in FIG. 25, according to some embodiments.

FIG. 28 illustrates a first side view of the mounting system illustrated in FIG. 25, according to some embodiments.

FIG. 29 illustrates a front view of the mounting system illustrated in FIG. 25, according to some embodiments.

FIG. 30 illustrates a second side view of the mounting system illustrated in FIG. 25, according to some embodiments.

FIG. 31 illustrates a bottom view of the mounting system illustrated in FIG. 25, according to some embodiments.

FIG. 32 illustrates a back view of the mounting system illustrated in FIG. 25, according to some embodiments.

DETAILED DESCRIPTION

Although certain embodiments and examples are disclosed below, inventive subject matter extends beyond the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence.

Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components.

For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Electronic devices include many types of devices. Electronic devices can include devices that send content (e.g., movies, TV shows, games) to televisions. Electronic devices can include Digital Video Disc (DVD) players, Blu-ray players, digital media extenders, and digital media players. Digital media players can include gaming consoles and devices such as Apple TV (made by Apple, Inc.), Roku players (made by Roku, Inc.), and Amazon Fire TV (made by Amazon.com, Inc.). Electronic devices can include gaming consoles such as Xbox devices (made by Microsoft Corporation), PlayStation devices (made by Sony Corporation), and Wii devices (sold by Nintendo of America Inc.).

Digital media players often transmit digital signals wirelessly or through a wire such as a High-Definition Multimedia Interface (HDMI) cable to a screen that displays an image based on the digital signal. Screens include computer monitors, televisions, and image-producing portions of movie projectors. Televisions include flat-panel displays, flat-screen televisions, and tube televisions.

Owners of digital media players may prefer to mount their digital media players near their screens. For example, a person who owns a flat screen television that is mounted on the wall might want to mount her Apple TV and her Xbox onto her flat screen television, onto the wall behind her flat screen television, or onto a wall near her television.

Mounting systems can be used to couple electronic devices to a wall, such as a wall of a building or a wall of a television.

Figure 1:
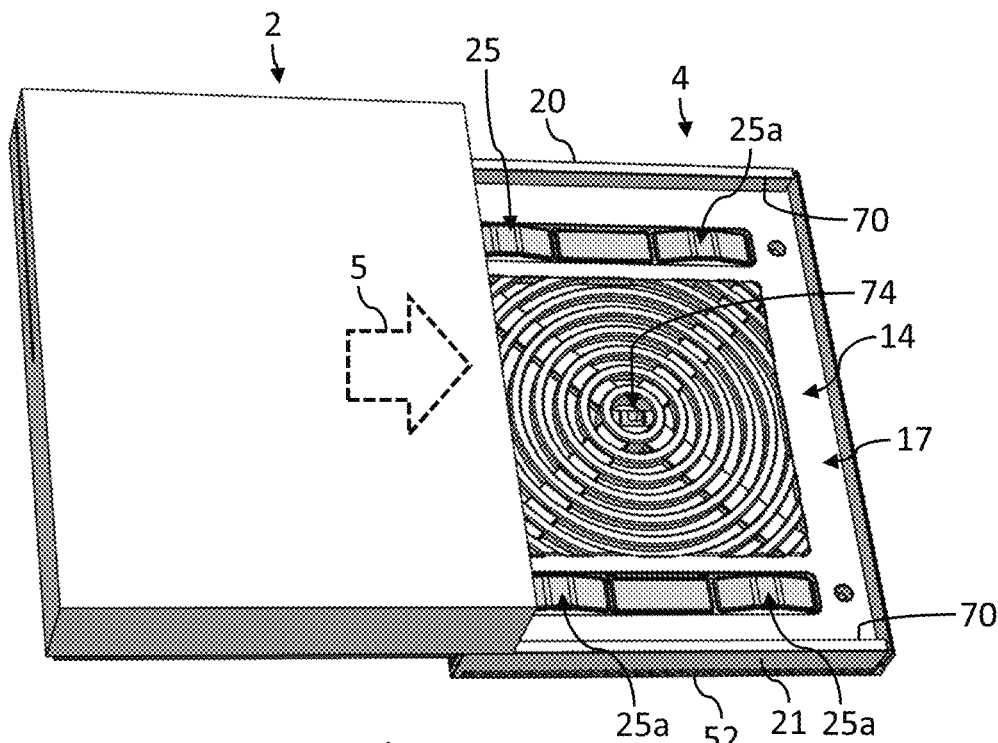
FIG. 1 illustrates a perspective view of an electronic device being inserted into a mounting system, according to some embodiments.
Figure 2:
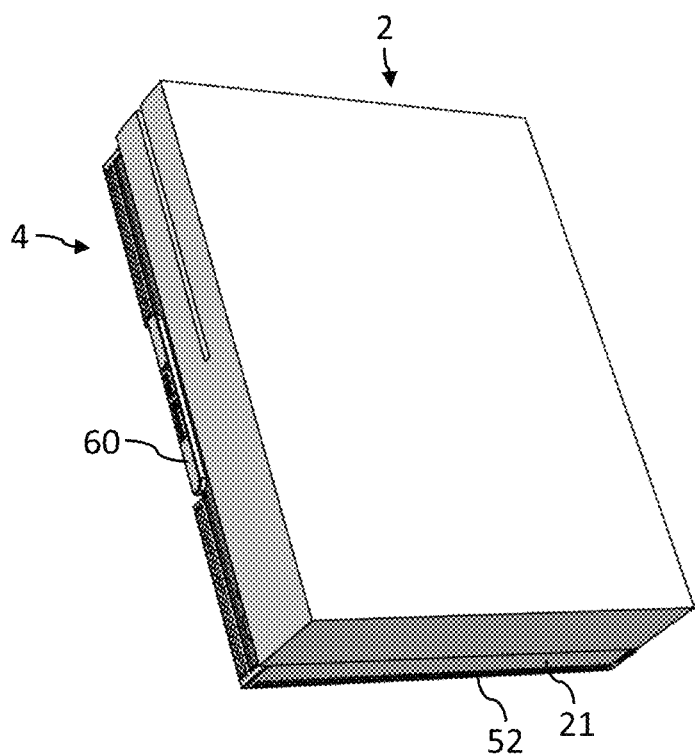
FIG. 2 illustrates a perspective view after the electronic device has been inserted into the mounting system, according to some embodiments.

FIG. 1 illustrates a perspective view of an electronic device 2 being inserted into a mounting system 4 (in the direction indicated by the arrow 5). FIG. 2 illustrates a perspective view after the electronic device 2 has been inserted into the mounting system 4.

The width of a particular style of electronic device (e.g., an Xbox One S) can vary slightly due to normal manufacturing tolerances. In addition, the width between the sidewalls 20, 21 of the mounting system 4 can also vary slightly due to normal manufacturing tolerances. This variability can be compensated for by making the nominal dimensions of the mount 4 deliberately larger than the corresponding dimensions of the electronic device 2. Although this approach ensures the electronic device 2 will fit inside the mounting system 4 even at extreme ends of the tolerance ranges, this approach also can result in a loose fit that can cause the electronic device 2 to "rattle" when coupled to a wall 6 by the mounting system 4.

Mounting systems 4 can eliminate this "rattle" by including protrusions 25, 25b, 25c configured to push the electronic device 2 away from the mounting system 4, base 14, and wall 6. Although pushing the electronic device 2 away from the wall 6 to which the electronic device 2 user wants to couple the electronic device 2 is highly counter-intuitive, the embodiments described herein are highly effective.

Figure 3:
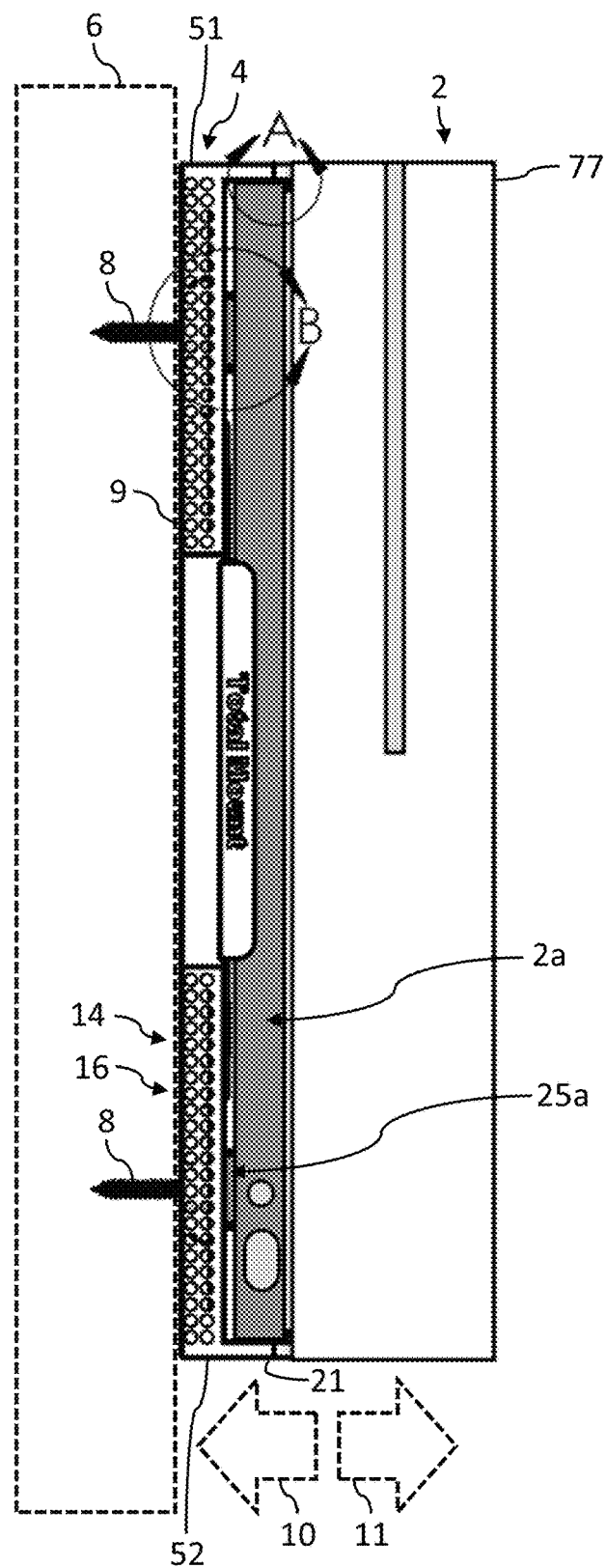
FIG. 3 illustrates a side view of an electronic device inserted into the mounting system such that the mounting system couples the electronic device to a wall, according to some embodiments.

FIG. 3 illustrates a side view of an electronic device 2 inserted into the mounting system 4 such that the mounting system 4 couples the electronic device to a wall 6. A cross-sectional view of the wall 6 is illustrated in FIG. 3. Screws 8, adhesive 9, and/or any other suitable means couple the mounting system 4 to the wall 6. Arrow 10 indicates an inward direction (i.e., a direction towards the wall 6). Arrow 11 indicates an outward direction (i.e., a direction away from the wall 6). In FIG. 3, the backside 16 of the base 14 faces inward towards the wall 6.

Referring now primarily to FIGS. 1-3, a mounting system 4 can be configured to couple an electronic device 2 to a wall 6. The mounting system 4 can comprise a base 14 having a backside 16 configured to face inward towards the wall 6 and a frontside 17 configured to face outward away from the wall 6; a first sidewall 20 and a second sidewall 21 that are coupled to the base 14, are configured to protrude away from the wall 6, and are configured to secure the electronic device 2 to the base 14; and a first protrusion 25 coupled to the base 14 and configured to push the electronic device 2 outward away from the wall 6. As used herein, "push" does not necessarily mean move but means to press against with force.

Figure 4:
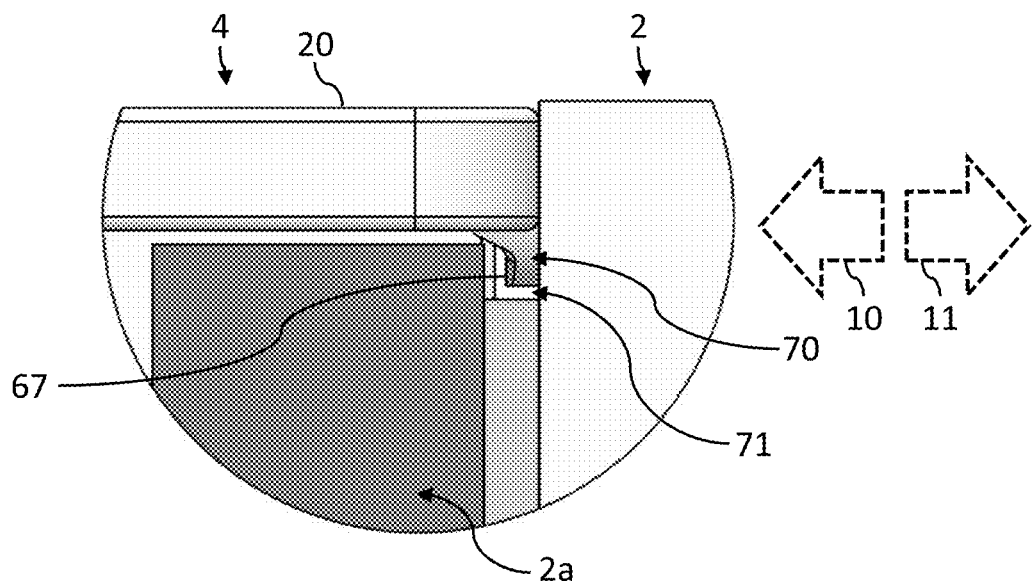
FIG. 4 illustrates a side, detailed view of the area indicated by Circle A in FIG. 3, according to some embodiments.
Figure 5:
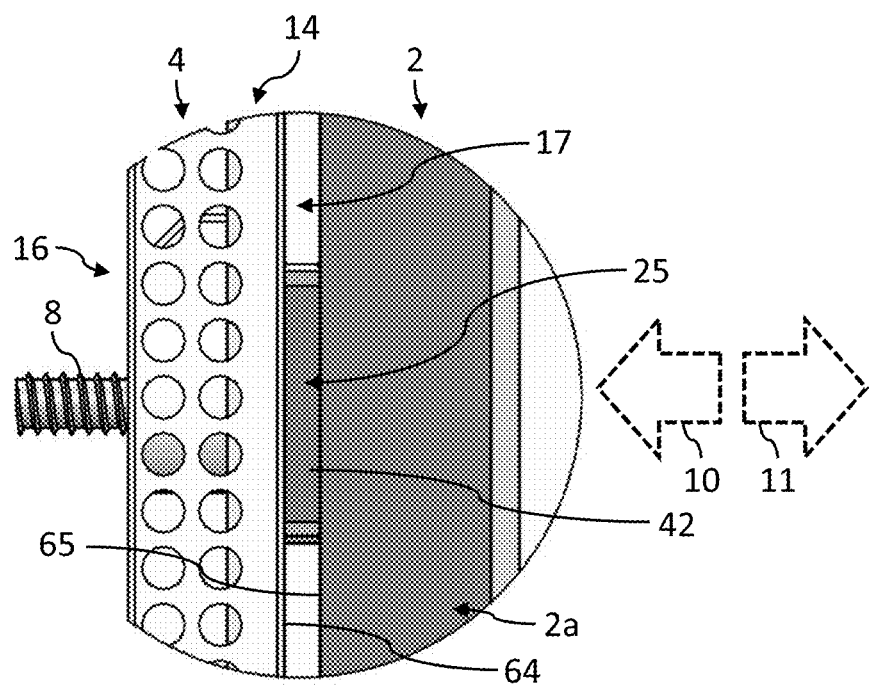
FIG. 5 illustrates a side, detailed view of the area indicated by Circle B in FIG. 3, according to some embodiments.

FIG. 4 illustrates a side, detailed view of the area indicated by Circle A in FIG. 3. FIG. 5 illustrates a side, detailed view of the area indicated by Circle B in FIG. 3.

Figure 6:
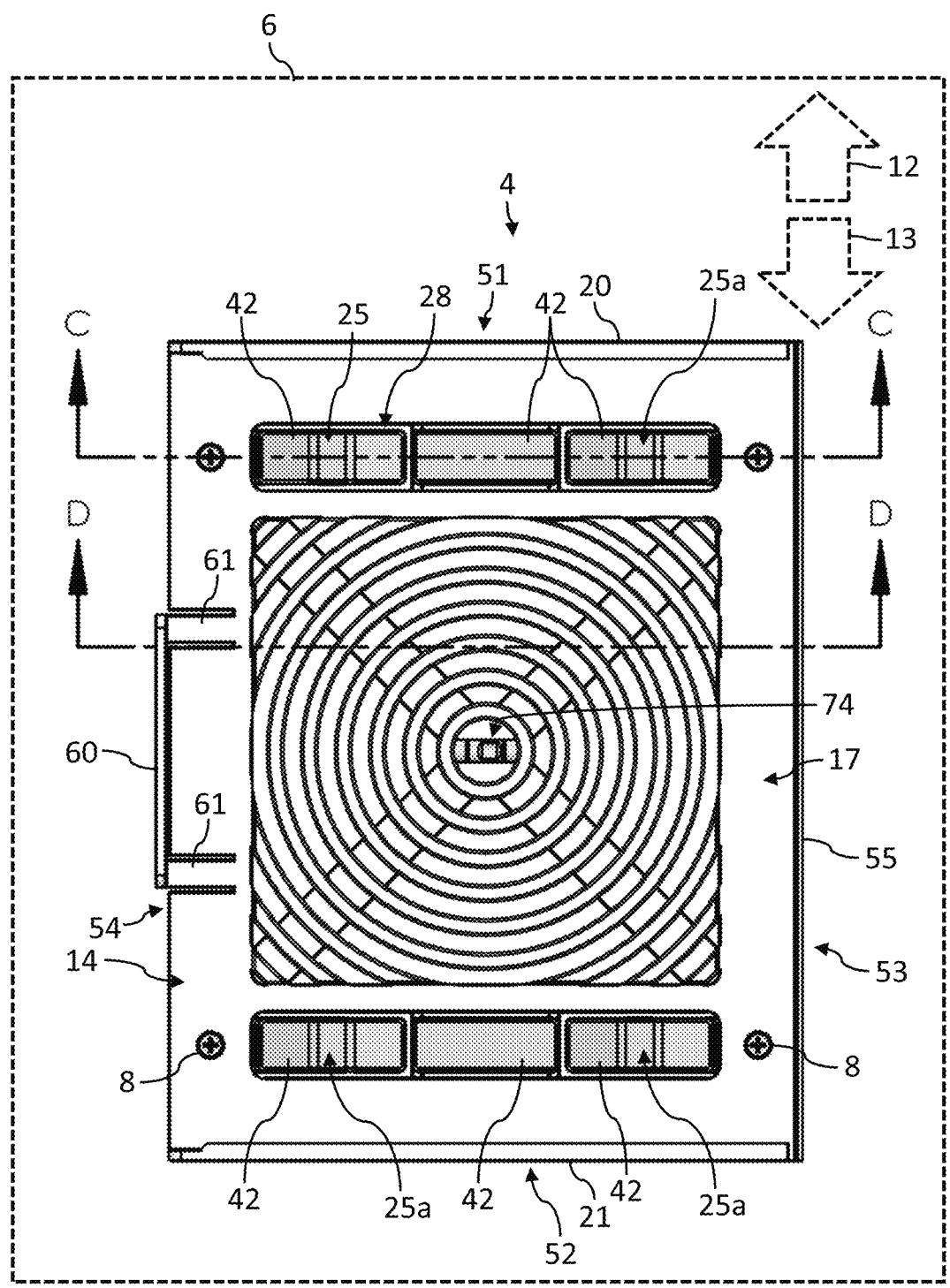
FIG. 6 illustrates a front view of the mounting system coupled to a wall, according to some embodiments.

FIG. 6 illustrates a front view of the mounting system 4 coupled to a wall 6. The protrusions 25, 25a are each supported at one end to form cantilever beams. (A small portion of the wall 6 is shown in FIG. 6.) Arrow 12 indicates an upward direction. Arrow 13 indicates a downward direction.

Figure 7:
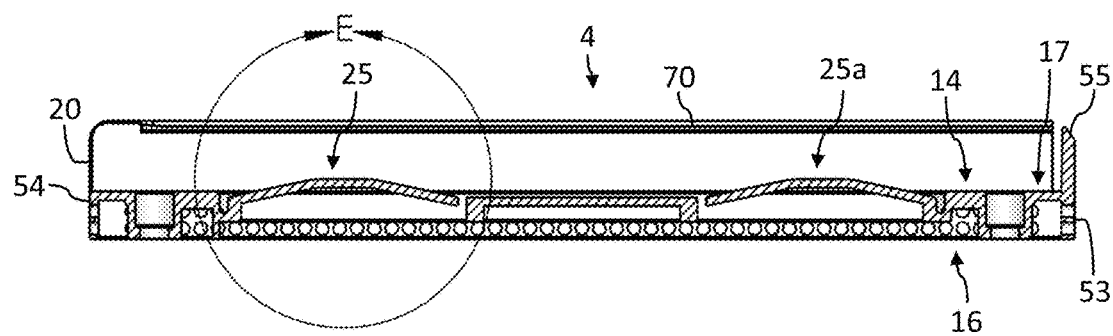
FIG. 7 illustrates a cross-sectional view taken along Line C-C in FIG. 6, according to some embodiments.
Figure 8:
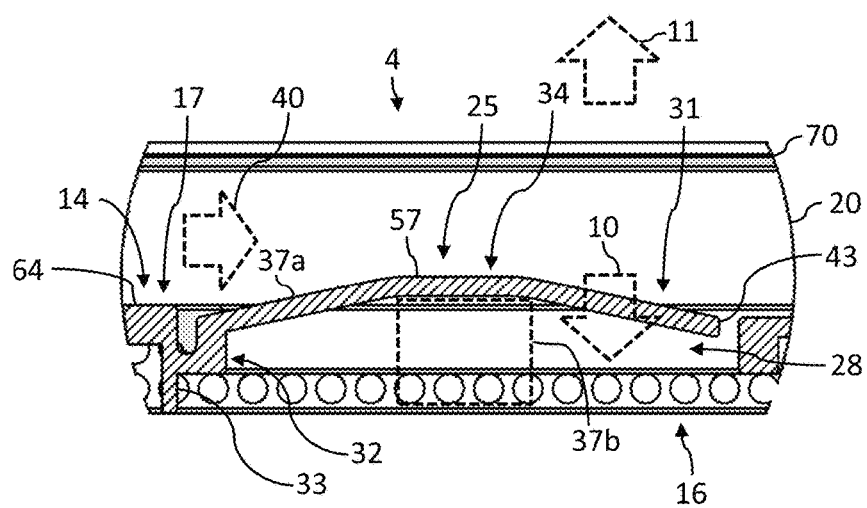
FIG. 8 illustrates a detailed view of the area indicated by Circle E in FIG. 7, according to some embodiments.

FIG. 7 illustrates a cross-sectional view taken along Line C-C in FIG. 6. FIG. 8 illustrates a detailed view of the area indicated by Circle E in FIG. 7.

Referring now primarily to FIGS. 6-8, the base 14 comprises a hole 28. The first protrusion 25 can be spring-loaded outward from the hole 28. The first protrusion 25 can be configured such that pressing the first protrusion 25 inward moves at least a second portion 31 of the first protrusion 25 inward through the hole 28 of the base 14. Moving at least a second portion 31 of the first protrusion 25 inward through the hole 28 can be accomplished by moving the first protrusion 25 part way through the hole 28 and does not necessarily mean moving an object all the way through the hole 28. The hole 28 can be a "through hole" or can be a hole with a closed bottom (such as a valley). In some embodiments, the hole 28 is much wider than it is deep. Thus, holes can be very shallow.

Embodiments can use any type of spring. For example, embodiments can use cantilever springs, coil springs, tension springs, extension springs, torsion springs, constant springs, variable springs, flat springs, machined springs, serpentine springs, helical springs, volute springs, hairsprings, balance springs, leaf springs, V-springs, Belleville springs, gas springs, mainsprings, negator springs, progressive rate coil springs, rubber bands, spring washers, torsion springs, and/or wave springs. Springs can be made from any suitable material including molded plastic, elastic materials, and/or spring steel.

For example, the first protrusion 25 can comprise a spring portion 37a configured to flex (e.g., to create a flex arm of a cantilever beam). Bending the spring 37a can cause portions 31 and 34 to move inward (as indicated by the arrow 10 in FIG. 8).

Embodiments can also include other types of springs (e.g., a coil spring 37b). The spring 37b can be located inward relative to the first protrusion 25 such that the first protrusion 25 has a neutral position (as illustrated in FIG. 8) located in an insertion path 40 of the electronic device 2. Moving the first protrusion 25 inward can compress the spring 37b such that the spring 37b resists inward movement of the first protrusion 25.

In several embodiments, the base 14 comprises a hole 28 configured to enable the first protrusion 25 to move inward through the hole 28 (e.g., as the first protrusion 25 is pressed inward in response to inserting the electronic device 2 into the mount). At least a first portion 32 of the first protrusion 25 can be anchored to a side 33 of the hole 28. As used herein, anchor means to hold in place. An anchor can be a rigid connection. In some embodiments, anchors are not rigid connections but instead are features that block unwanted movement. For example, an anchor can be an outer wall that prevents the first protrusion 25 from moving too far outward while still permitting the first protrusion 25 to move inward in response to inserting the electronic device 2.

In some embodiments, at least a portion of the first protrusion 25 is located between the first sidewall 20 and the second sidewall 21. A spring can couple the protrusion to the base 14 such that coupling the electronic device 2 to the base 14 (by placing the electronic device 2 at least partially between the first sidewall 20 and the second sidewall 21) presses the protrusion inward by overcoming a resistance force of the spring. The spring can be any type of spring including a cantilever spring and a coil spring.

In several embodiments, the first protrusion 25 comprises a cantilever beam having a first portion 32 anchored to the base 14 and a second portion 31 configured to bend inward (as indicated by arrow 10) in response to coupling the electronic device 2 to the base 14 by placing the electronic device 2 at least partially between the first sidewall 20 and the second sidewall 21.

In some embodiments, the first portion 32 is located farther inward than the second portion 34 such that (A) the first portion 32 is not configured to collide with the electronic device 2 as the electronic device 2 is coupled to the mounting system 4 and (B) the second portion 34 is configured to collide with the electronic device 2 as the electronic device 2 is coupled to the mounting system 4.

In some embodiments, the cantilever beam is curved such that the first portion 32 is located further inward than the second portion 34. The cantilever beam can comprise a first section and a second section. The first section can be oriented at a greater angle relative to the base 14 than the second section is oriented relative to the base 14. (The outer-facing wall 64 of the base 14 can define the orientation of the base 14.) The angle of the first section can facilitate a gradual transition as the electronic device 2 is inserted into the mount such that pressing the cantilever beam inward does not require a large electronic device 2 insertion force.

In several embodiments, the base 14 comprises a hole 28. The cantilever beam can be located at least partially inside the hole 28 such that the second portion 31, 34 of the cantilever beam is configured to bend inward at least partially through the hole 28 in response to coupling the electronic device 2 to the base 14.

In some embodiments, the first portion 32 is anchored to the base 14 inside the hole 28 of the base 14. The second portion 34 can be located outward relative to the hole 28 such that the second portion 34 is configured to collide with the electronic device 2 as the electronic device 2 is coupled to the mounting system 4.

Mounts can be machined and/or formed from a metal such as steel or aluminum. Mounts can also be made by molding plastic.

Mounting systems can be molded from acrylonitrile butadiene styrene ("ABS"). In some embodiments, surfaces of the mounting systems that may touch portions of the electronic device are overmolded with a softer material, which can be a thermoplastic elastomer ("TPE").

Referring now primarily to FIGS. 5 and 6, a rubber layer 42 can be coupled to an outward facing surface of the cantilever beam. The system can comprise the electronic device 2 coupled at least partially between the first sidewall 20 and the second sidewall 21 such that at least a portion of the rubber layer 42 is compressed between the electronic device 2 and the cantilever beam (as illustrated in FIG. 5). The base 14 and sidewalls 20, 21 (and other parts of the mount 4) can be made from a first material. The first material can be molded plastic. The rubber layer 42 can be made from a second material that is softer than the first material.

Referring now primarily to FIGS. 1 and 8, the system 4 is configured to enable inserting the electronic device 2 into the system 4 in a first direction 40. The first protrusion 25 can comprise a cantilever beam 25 having an anchored end 32 and a distal end 43 configured to move relative to the anchored end 32. The cantilever beam 25 comprises an orientation defined from the anchored end to the distal end 43. The orientation can be within plus or minus 30 degrees of parallel to or perpendicular to the first direction 40. As used herein, distal end means situated away from the point of attachment.

In several embodiments, the base 14 can comprise a hole 28. The cantilever beam can be located at least partially in the hole 28. The cantilever beam can be curved outward. The cantilever beam can be configured to move at least partially inward through the hole 28 in response to coupling the electronic device 2 to the base 14.

Referring now primarily to FIGS. 1, 3, 6, 8, and 9, the base 14 comprises a first side 51 coupled to the first sidewall 20, a second side 52 located opposite the first side 51 and coupled to the second sidewall 21, a third side 53 having a third sidewall 55 oriented within plus or minus 20 degrees of perpendicular to the first sidewall 20 and the second sidewall 21, and a fourth side 54 located opposite the third side 53 and configured to enable inserting the electronic device 2 at least partially into the mounting system 4 between the first sidewall 20 and the second sidewall 21. The first protrusion 25 can have an outermost portion 57 (labeled in FIG. 8) located between the first sidewall 20 and the second sidewall 21. The outermost portion 57 can be coupled to the base 14 by a spring such that a neutral position of the outermost portion 57 is located in an insertion path 40 of the electronic device 2 such that inserting the electronic device 2 pushes the outermost portion 57 inward while the outermost portion 57 applies an outward force on the electronic device 2. The first sidewall 20 and the second sidewall 21 can be configured to resist the outward force of the first protrusion 25 (e.g., as explained in the context of FIG. 4).

Embodiments can comprise additional protrusions 25a, 25b, 25c that can include all of the features of first protrusions 25. In some embodiments, the protrusions 25, 25a, 25b, 25c are oriented in opposite directions and/or are space apart in a rectangle shape.

The outward force of the first protrusion 25 can help hold the electronic device 2 snugly inside the mount by effectively removing extra space inside the mount. While the extra space is necessary due to manufacturing tolerances (e.g., variation in mount dimensions and electronic device 2 dimensions), the extra space can cause the electronic device 2 to rattle inside the mount 4. Thus, removing the extra space increases the perceived quality of the mounting system 4.

FIG. 7 illustrates a first protrusion 25 that protrudes towards the third side 53. FIG. 7 also illustrates a second protrusion 25a that protrudes towards a fourth side 54.

In several embodiments, the first protrusion 25 protrudes towards the fourth side 54. In some embodiments, the first protrusion 25 protrudes away from the fourth side 54. As used herein, the first protrusion 25 can protrude toward the fourth side 54 without protruding directly towards the fourth side 54. As used herein, the first protrusion 25 can protrude away from the fourth side 54 without protruding directly away from the fourth side 54. "Toward" is used broadly to mean in the direction of an object and does not require pointing exactly at an object. For example, protruding towards a side can be accomplished by protruding in a direction that makes the distal end of the protrusion closer to the side.

Figure 9:
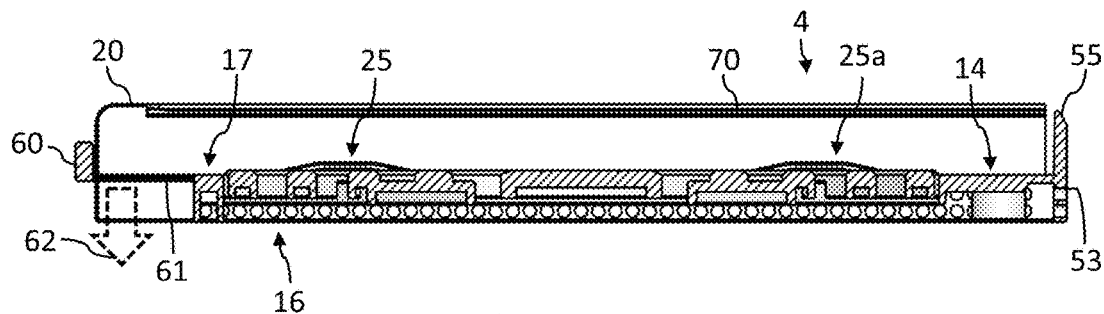
FIG. 9 illustrates a cross-sectional view taken along Line D-D in FIG. 6, according to some embodiments.
Figure 10:
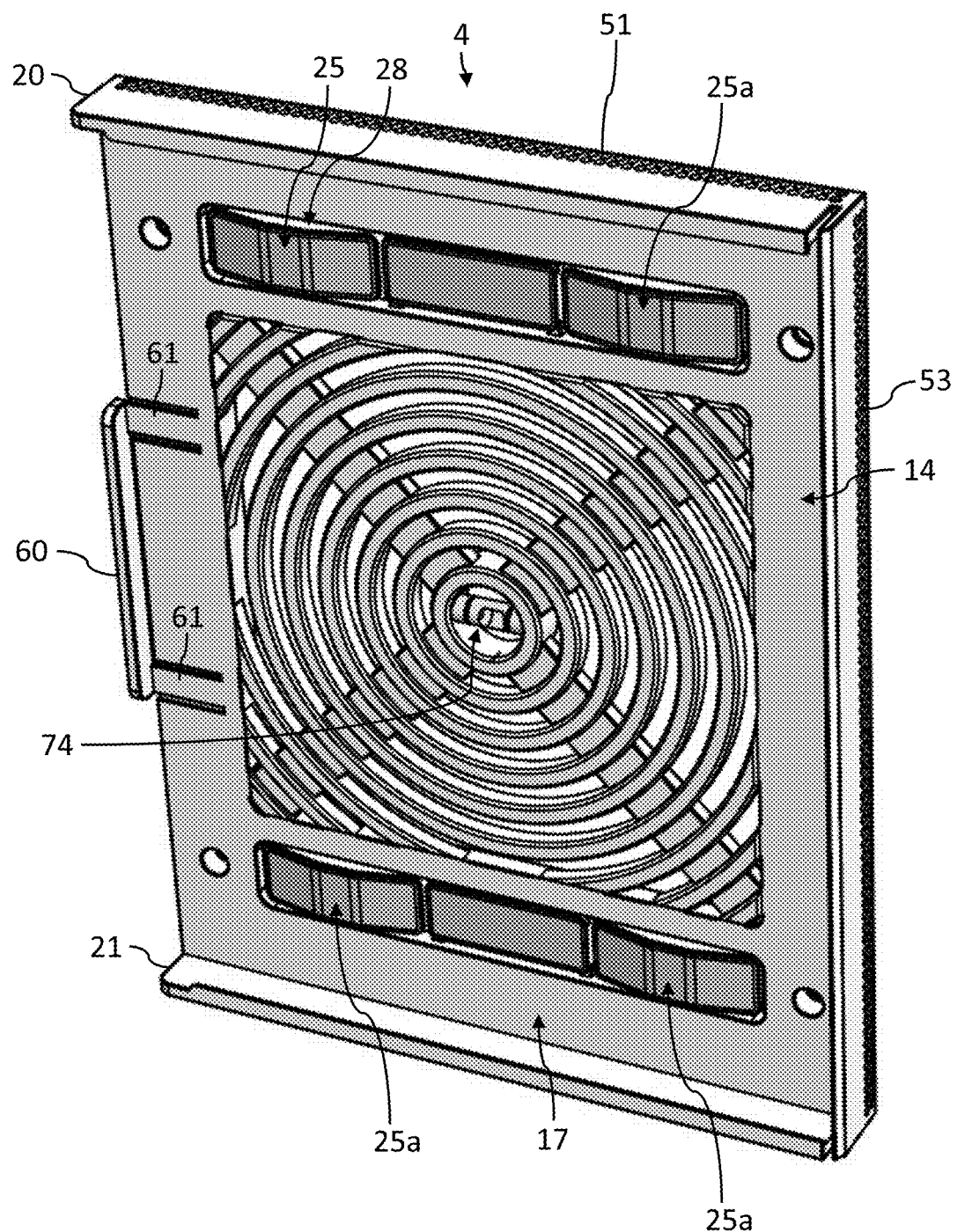
FIG. 10 illustrates a front perspective view of the mounting system illustrated in FIG. 6, according to some embodiments.
Figure 11:
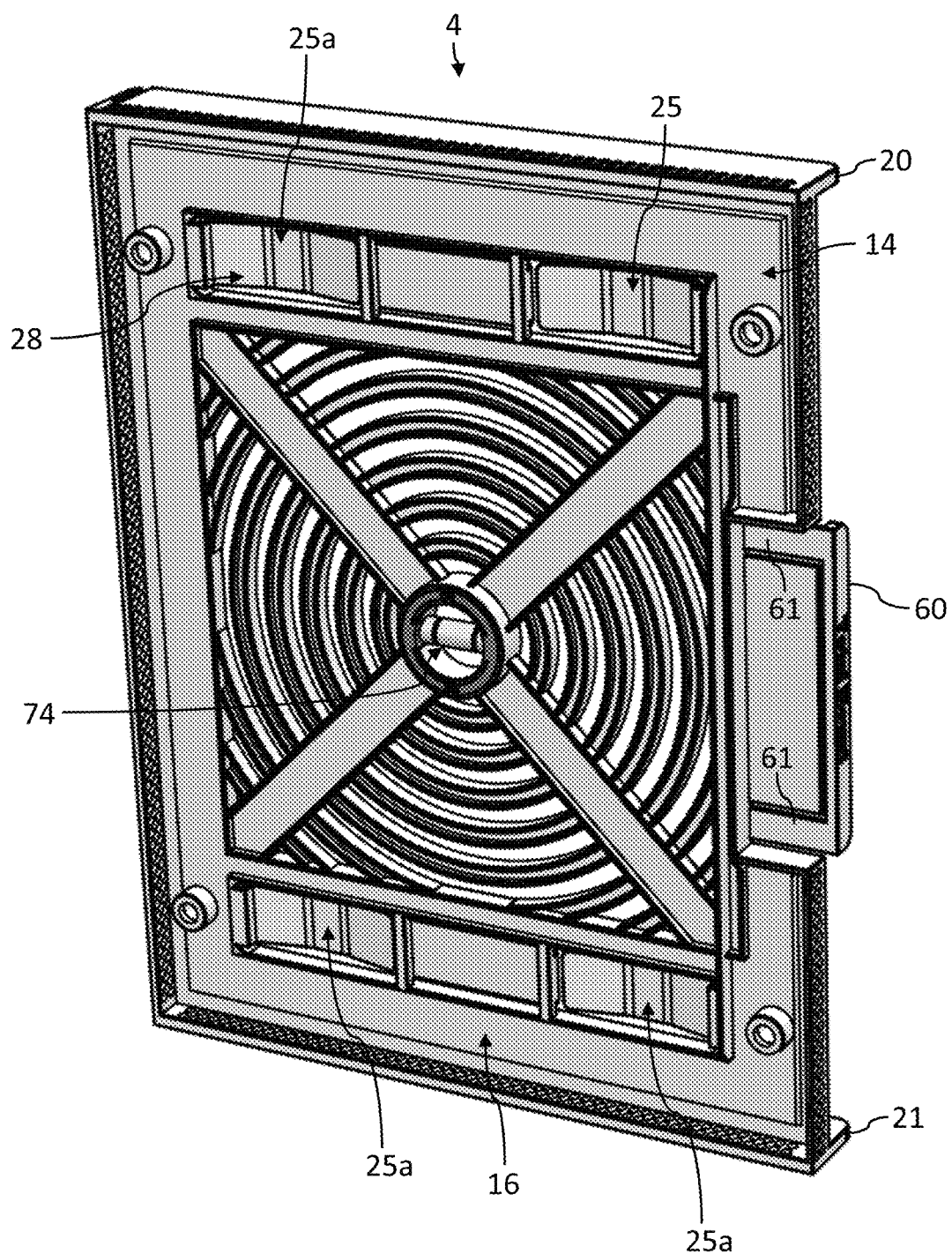
FIG. 11 illustrates a back perspective view of the mounting system illustrated in FIG. 6, according to some embodiments.

FIG. 9 illustrates a cross-sectional view taken along Line D-D in FIG. 6. The mounting system 4 can comprise a fourth sidewall 60 located opposite the third sidewall 55 and coupled to the base 14 by a flex arm 61 configured to bend to enable the fourth sidewall 60 to move inward out of the insertion path 40 of the electronic device 2. The arrow 62 illustrated in FIG. 9 indicates the fourth sidewall 60 moving inward due to bending of the flex arm 61. The fourth sidewall 60 can be much smaller than other sidewalls. The fourth sidewall 60 can help secure the electronic device 2 inside the mount 4 until the user pushes the fourth sidewall 60 inward to remove the electronic device 2 from the mount 4.

Referring now primarily to FIGS. 2-5 and 8, an electronic device 2 can be located at least partially between the first sidewall 20 and the second sidewall 21. As illustrated in FIG. 5, the first protrusion 25 (see FIG. 8) can be spring-loaded outward towards a first inward-facing wall 65 of the electronic device 2 such that the first inward-facing wall 65 of the electronic device 2 presses the first protrusion 25 inward.

In several embodiments, the electronic device 2 is located at least partially between an outward-facing wall 64 (see FIG. 5) of the base 14 and a second inward-facing wall 67 (see FIG. 4) coupled to the base 14 by the first sidewall 20. As illustrated in FIG. 8, the first protrusion 25 can be coupled to the base 14 by a second protrusion 32 located farther inward than the outward-facing wall 64 of the base 14. The first protrusion 25 can be located farther outward than the outward-facing wall 64 of the base 14.

The second inward-facing wall 67 can be part of a retaining lip 70 (e.g., a protrusion oriented within plus or minus 20 degrees of perpendicular to the sidewall 20). The sidewall 20 can couple the retaining lip 70 to the base 14. The retaining lip 70 can be located at least partially inside a groove 71 of the electronic device 2 such that the retaining lip 70 prevents the electronic device 2 from falling out of the mounting system 4 (as illustrated in FIG. 4). Inserting the electronic device 2 into the mounting system 4 (as indicated by the arrow 5 in FIG. 1) can cause the retaining lip 70 to slide into the groove 71. The electronic device 2 comprises an inward portion 2a.

In other embodiments, the retaining lip 70 is located outward relative to an outermost surface 77 of the electronic device 2 such that the retaining lip 70 engages the outermost surface 77 to prevent the electronic device 2 from falling out of the mounting system 4. (The outermost surface 77 of the electronic device 2 is labeled in FIG. 3.)

As shown in FIG. 6, the mounting system 4 can comprise a level 74 (e.g., a bubble level) configured to indicate whether the mounting system 4 is coupled to a wall 6 in a level manner. The level 74 can comprise a hollow tube partially filled with a liquid such that the extra space inside the sealed tube comprises an air bubble. The position of the air bubble can indicate whether the mounting system 4 is level.

Figure 12:
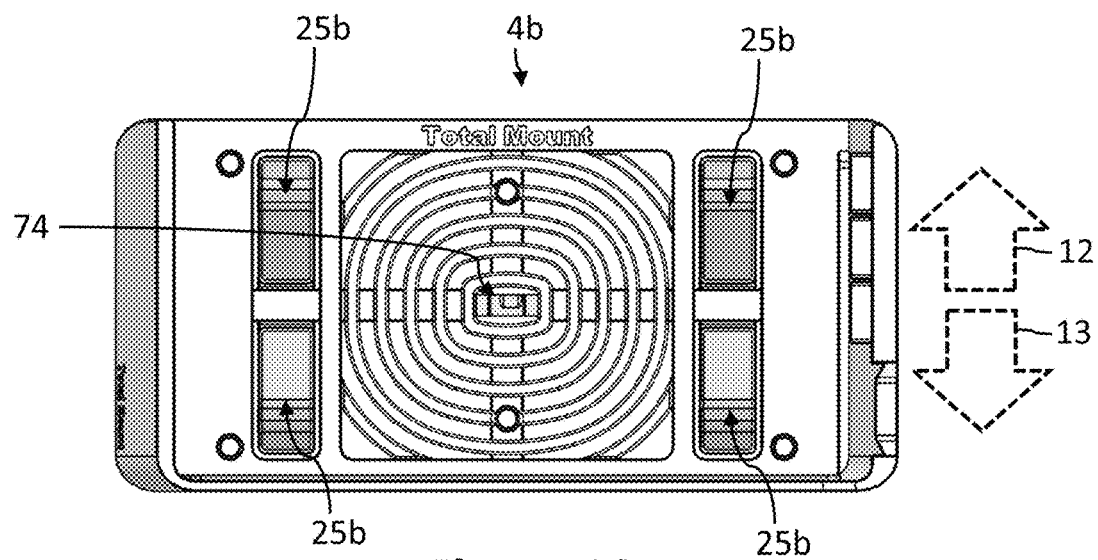
FIG. 12 illustrates a front view of a mounting system, according to some embodiments.
Figure 13:
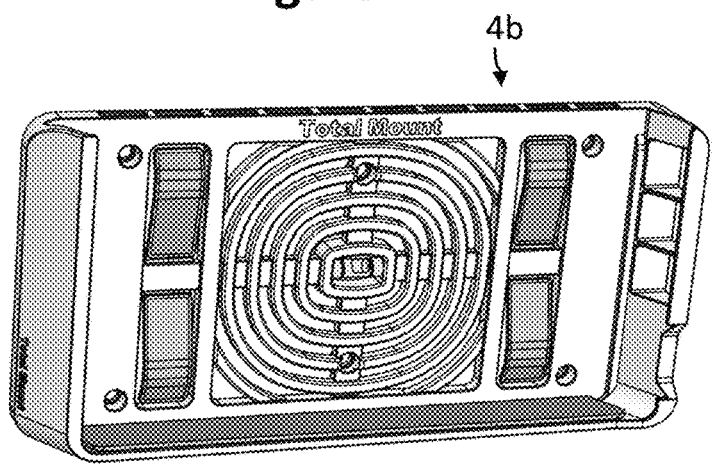
FIGS. 13 and 14 illustrate front perspective views of the mounting system illustrated in FIG. 12, according to some embodiments.
Figure 14:
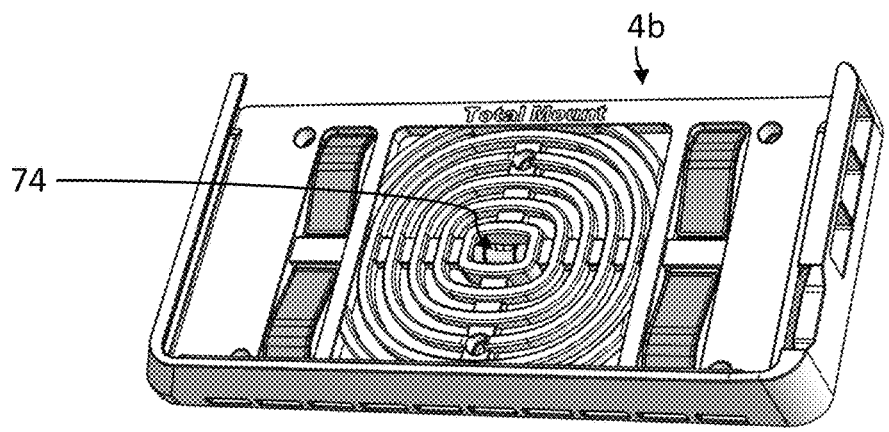
Figure 15:
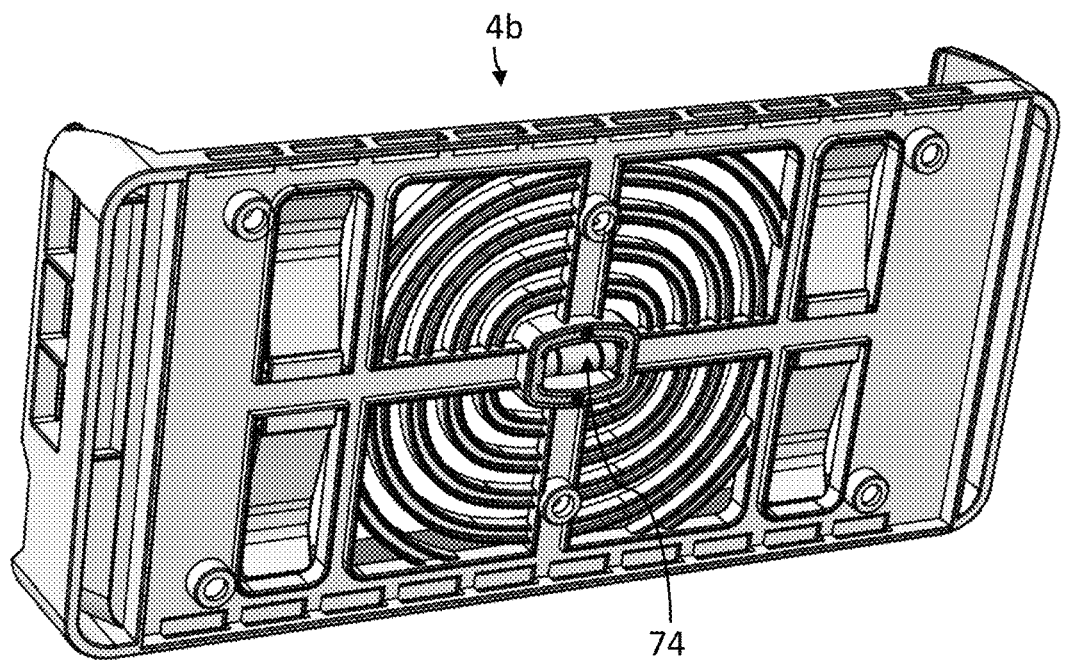
FIGS. 15 and 16 illustrate back perspective views of the mounting system illustrated in FIG. 12, according to some embodiments.
Figure 16:
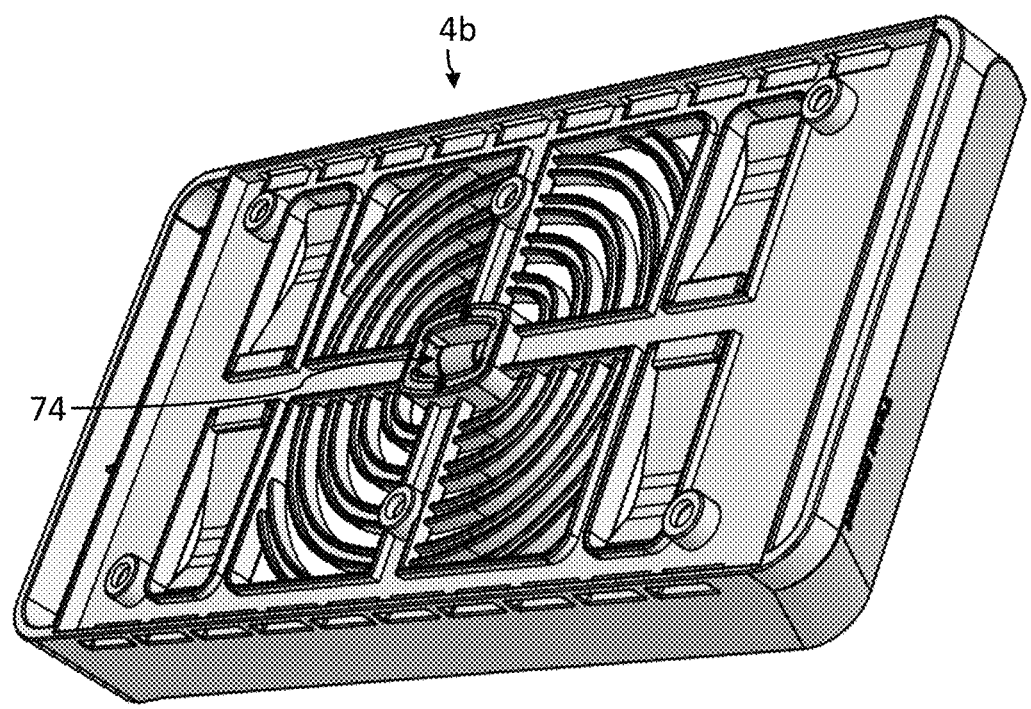
Figure 17:
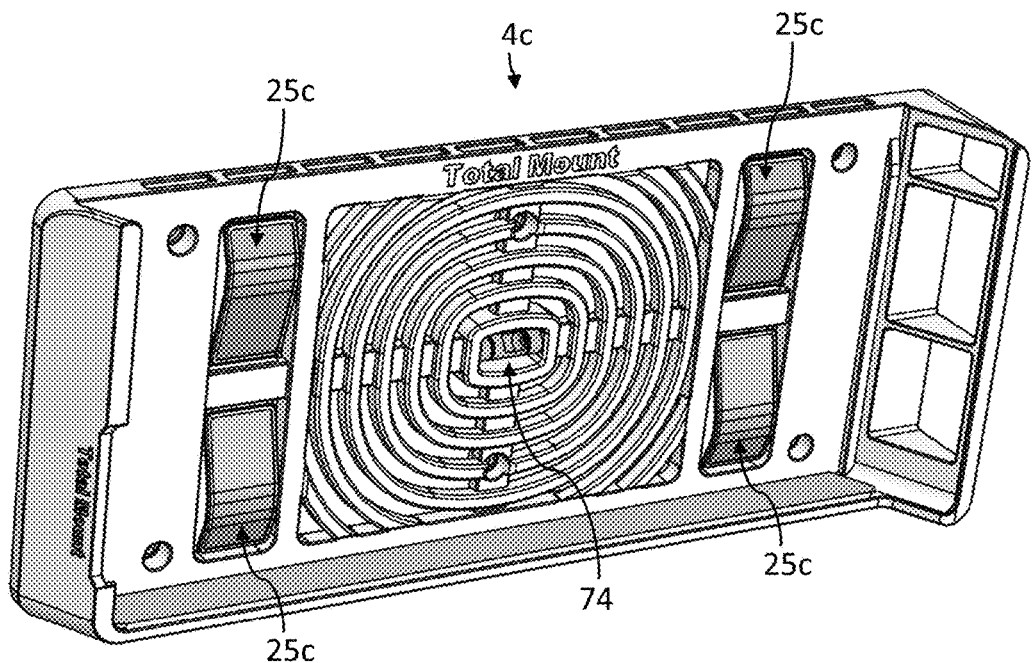
FIG. 17 illustrates a front, top, and side perspective view of a mounting system, according to some embodiments.
Figure 18:
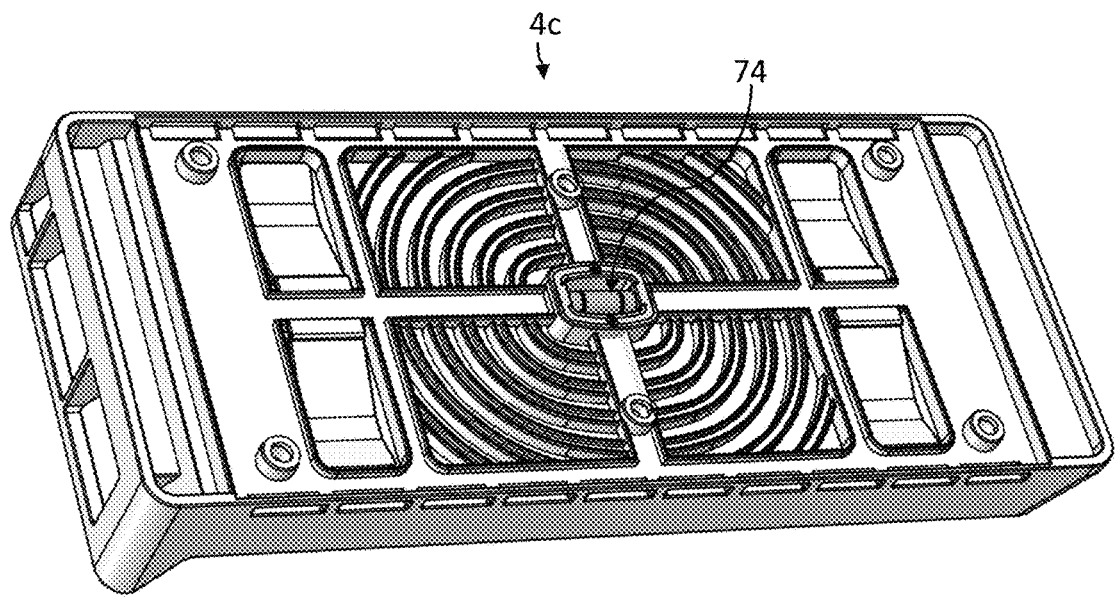
FIG. 18 illustrates a back, bottom, and side perspective view of the mounting system illustrated in FIG. 17, according to some embodiments.
Figure 19:
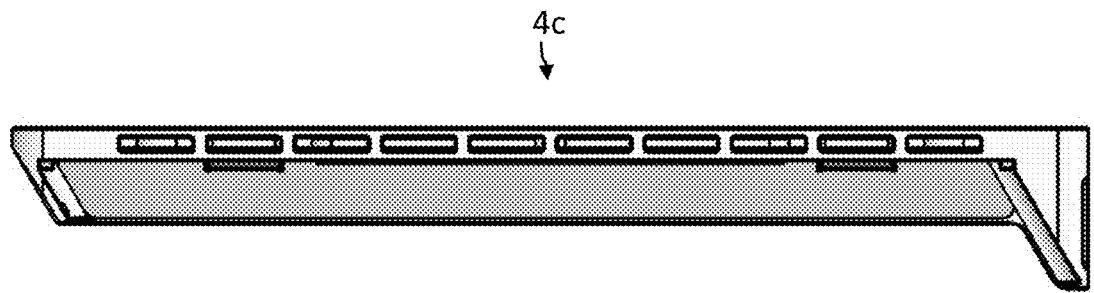
FIG. 19 illustrates a top view of the mounting system illustrated in FIG. 17, according to some embodiments.
Figure 20:
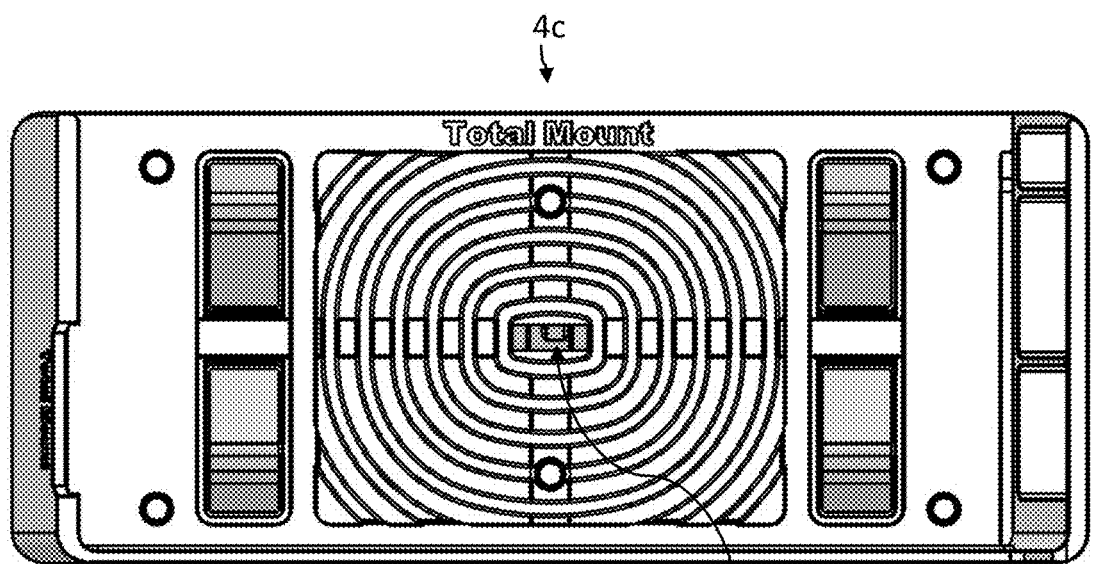
FIG. 20 illustrates a front view of the mounting system illustrated in FIG. 17, according to some embodiments.
Figure 21:
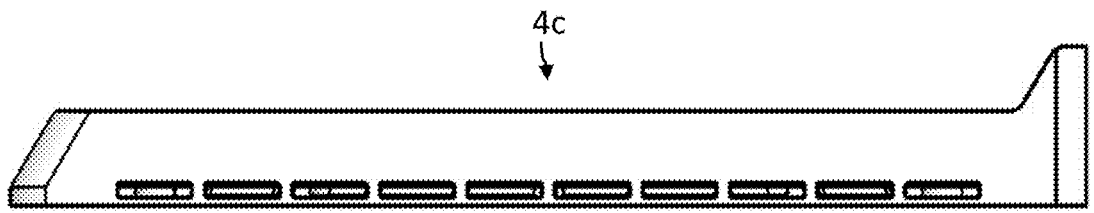
FIG. 21 illustrates a bottom view of the mounting system illustrated in FIG. 17, according to some embodiments.
Figure 22:
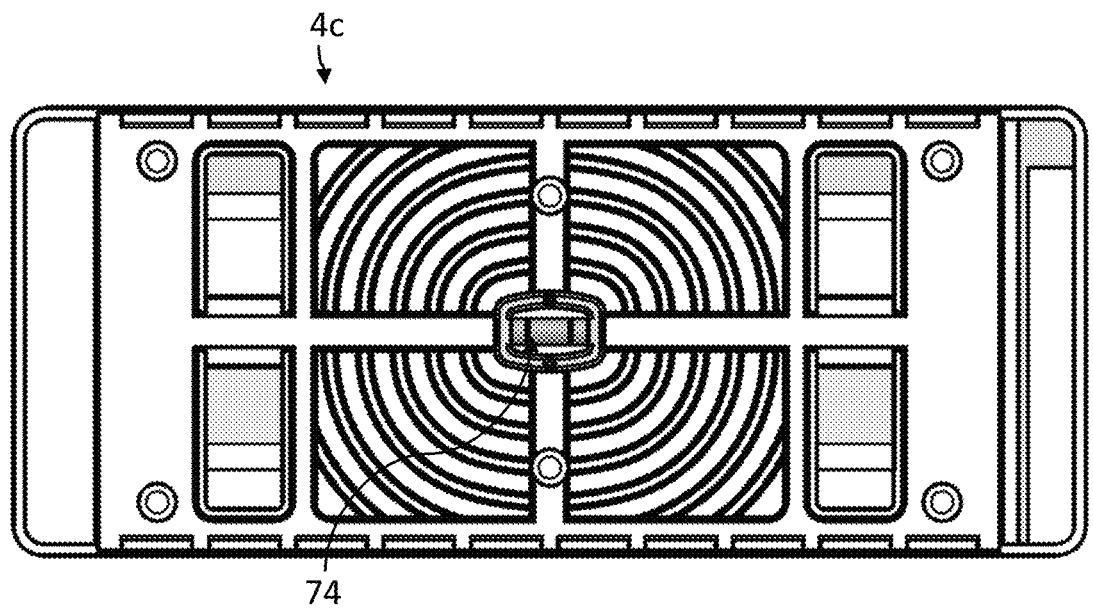
FIG. 22 illustrates a back view of the mounting system illustrated in FIG. 17, according to some embodiments.
Figure 23:
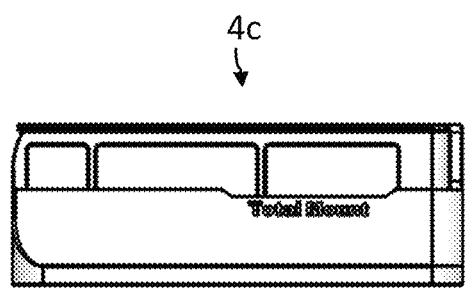
FIG. 23 illustrates a first side view of the mounting system illustrated in FIG. 17, according to some embodiments.
Figure 24:
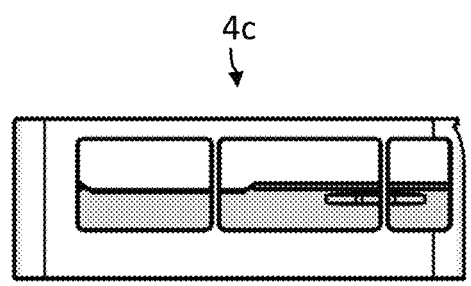
FIG. 24 illustrates a second side view of the mounting system illustrated in FIG. 17, according to some embodiments.

FIGS. 12-16 illustrate another mounting system 4b that can use any of the elements described in the context of the mounting system 4 shown in FIGS. 1-11. In FIG. 12, Arrow 12 indicates an upward direction. Arrow 13 indicates a downward direction.

FIGS. 17-24 illustrate another mounting system 4c that can use any of the elements described in the context of the mounting system 4 shown in FIGS. 1-11. Additional mounting systems are illustrated in U.S. patent application Ser. Nos. 29/581,848; 29/581,849; 29/582,715; 15/131,337 and 29/540,690, the entire contents of which are incorporated by reference herein. The entire contents of U.S. patent application Ser. No. 15/424,837 are incorporated by reference herein.

Any of the systems described herein can be used with any of the methods described herein. Any of the methods described herein can be used with any of the systems described herein. Each of the system embodiments can be used as method embodiments.

In some embodiments, methods comprise coupling an electronic device 2 to a wall 6 (e.g., a wall of a building, a wall of a television). Embodiments can comprise obtaining a mounting system 4 comprising a base 14 having a backside 16 facing inward towards the wall 6 and a frontside 17 facing outward away from the wall 6; a first sidewall 20 and a second sidewall 21 that are coupled to the base 14, protrude away from the wall 6, and secure the electronic device 2 to the base 14; and a first protrusion 25 coupled to the base 14 and configured to push the electronic device 2 outward away from the wall 6.

Methods can comprise coupling the mounting system 4 to the wall 6. Methods can comprise overcoming a spring force of the first protrusion 25 to move the first protrusion 25 inward towards the wall 6 by inserting at least a portion of the electronic device 2 between the first sidewall 20 and the second sidewall 21 such that the first protrusion 25 presses the electronic device 2 outward while the first sidewall 20 and the second sidewall 21 block the electronic device 2 from moving outward.

In several embodiments, the first protrusion 25 comprises a cantilever beam having a first portion 32 anchored to the base 14 and a second portion 31, 34 coupled to the first portion 32. Embodiments can comprise bending the second portion 31, 34 inward in response to coupling the electronic device 2 to the base 14.

In some embodiments, the first protrusion 25 is spring-loaded outward from a hole 28. Embodiments can comprise pressing the first protrusion 25 inward (such that the first protrusion 25 moves at least a second portion 31, 34 of the first protrusion 25 inward through the hole 28) by inserting the electronic device 2 into the mount such that at least a portion of the electronic device 2 is located between the first sidewall 20 and the second sidewall 21. A spring can be located between the first protrusion 25 and an inward side of the base 14 such that the spring is configured to press the first protrusion 25 outward into the insertion path 40 of the electronic device 2.

FIGS. 25-40 illustrate another shelf system 4*d* that can use any of the elements described in the context of the shelf systems 4, 4*b*, 4*c* shown in FIGS. 1-24. The embodiments described in the context of FIGS. 1-24 and use any of the elements described in the context of FIGS. 25-40.

Figure 25:
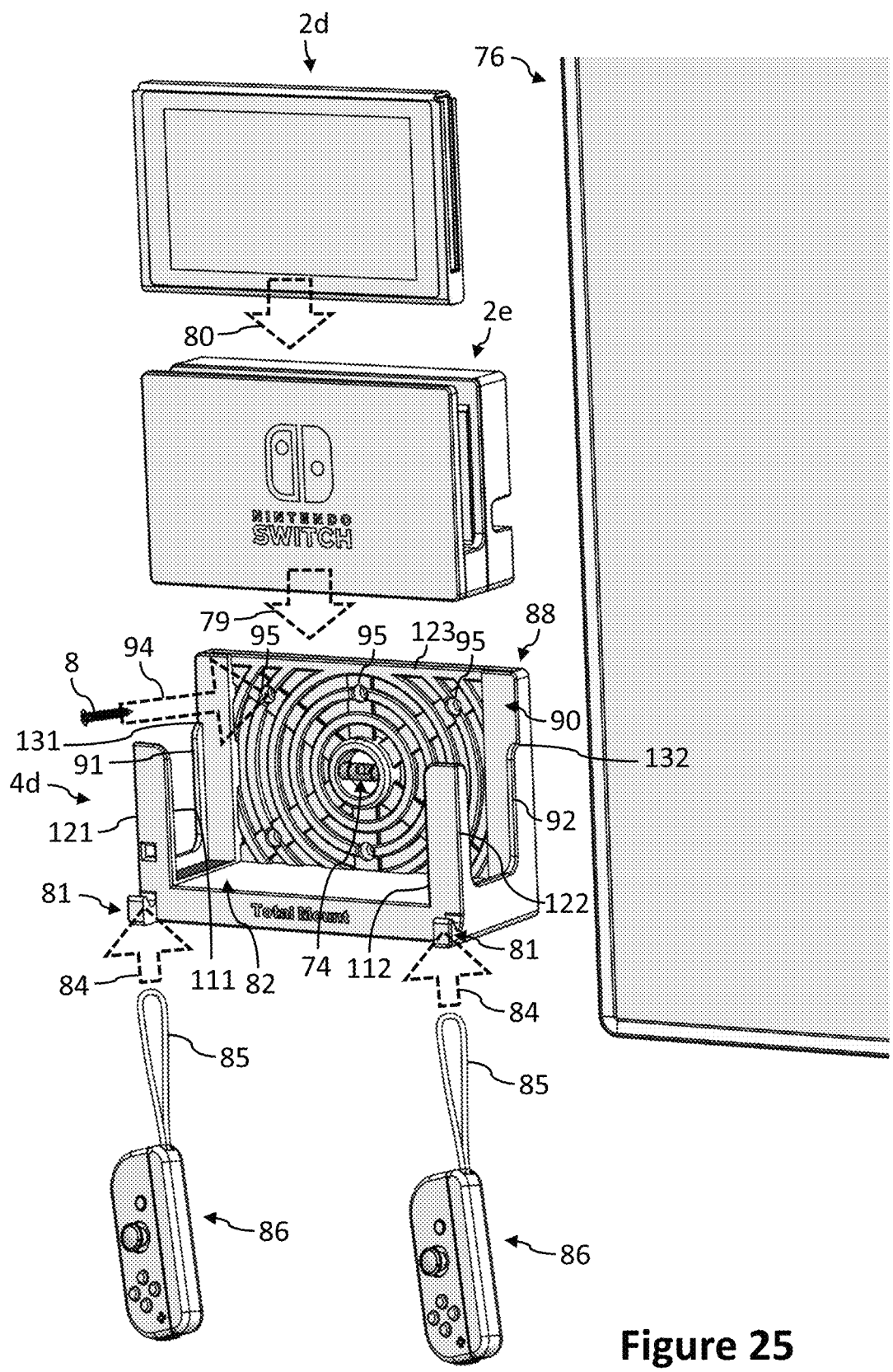
FIG. 25 illustrates a perspective view of a mounting system coupled to a wall near a television, according to some embodiments.

Shelf systems 4*d* can be used to couple electronic devices 2*d*, 2*e* to a wall 6, such as a wall 6 of a building or a wall 6 of a television. FIG. 25 illustrates a perspective view of a shelf system 4*d*. (FIGS. 1-24 illustrate other shelf-system embodiments.)

In FIG. 25, the shelf system 25 is coupled to a wall 6 (labeled in FIG. 37), which can be the same wall to which a television 76 is coupled. A portion of a television 76 is illustrated in FIG. 25. Electronic devices 2*e*, 2*d* can slide downward into the shelf system 4*d*. FIG. 25 illustrates a Nintendo Switch dock 2*e*. An HDMI cable can electrically couple the dock 2*e* to the television 76 such that the dock 2*e* can send data (e.g., gaming information) to facilitate the television 76 displaying a video game from the Nintendo Switch 2*d*.

Figure 26:
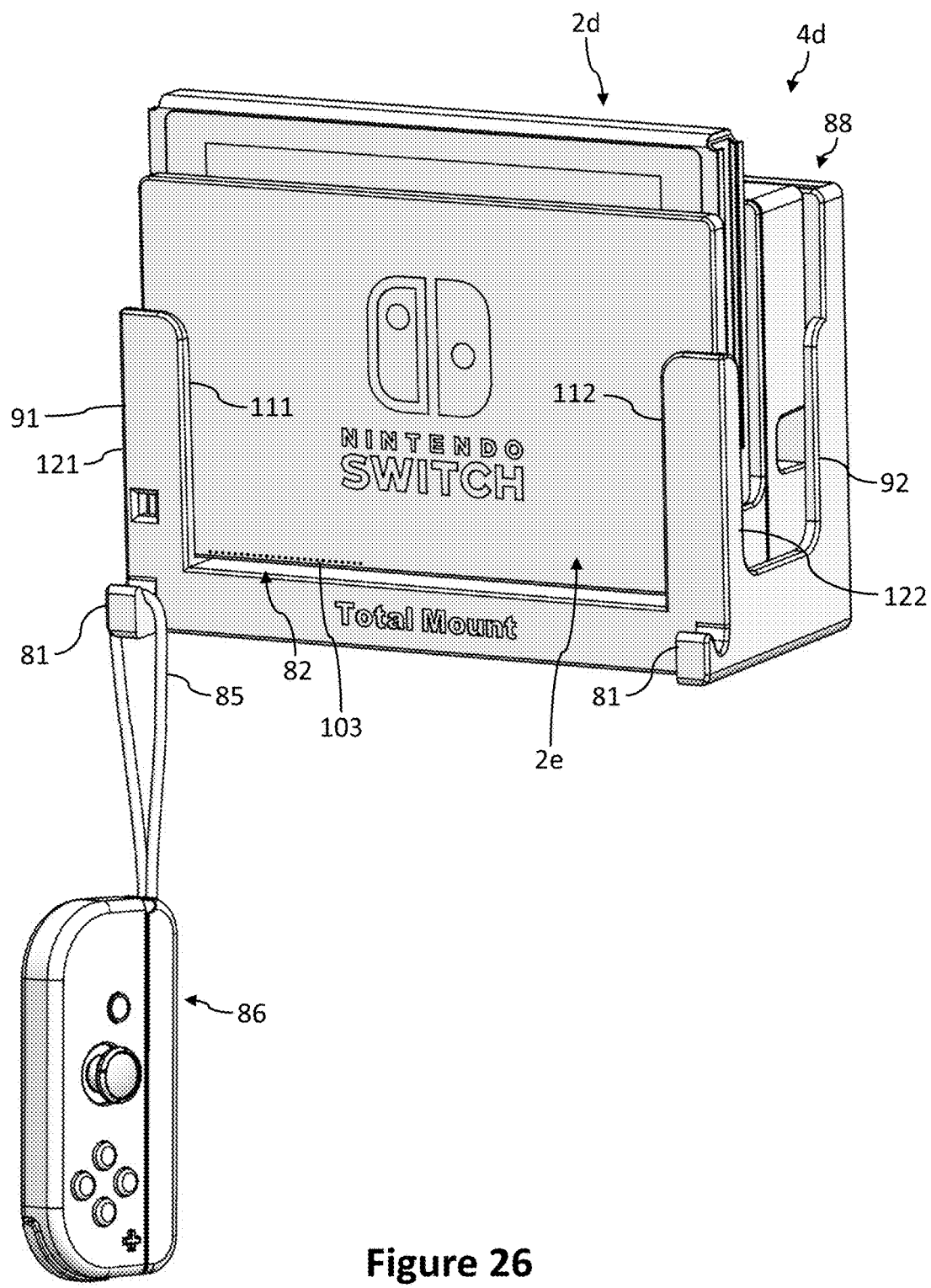
FIG. 26 illustrates a perspective view of the mounting system illustrated in FIG. 25 while the mounting system holds electronic devices, according to some embodiments.
Figure 37:
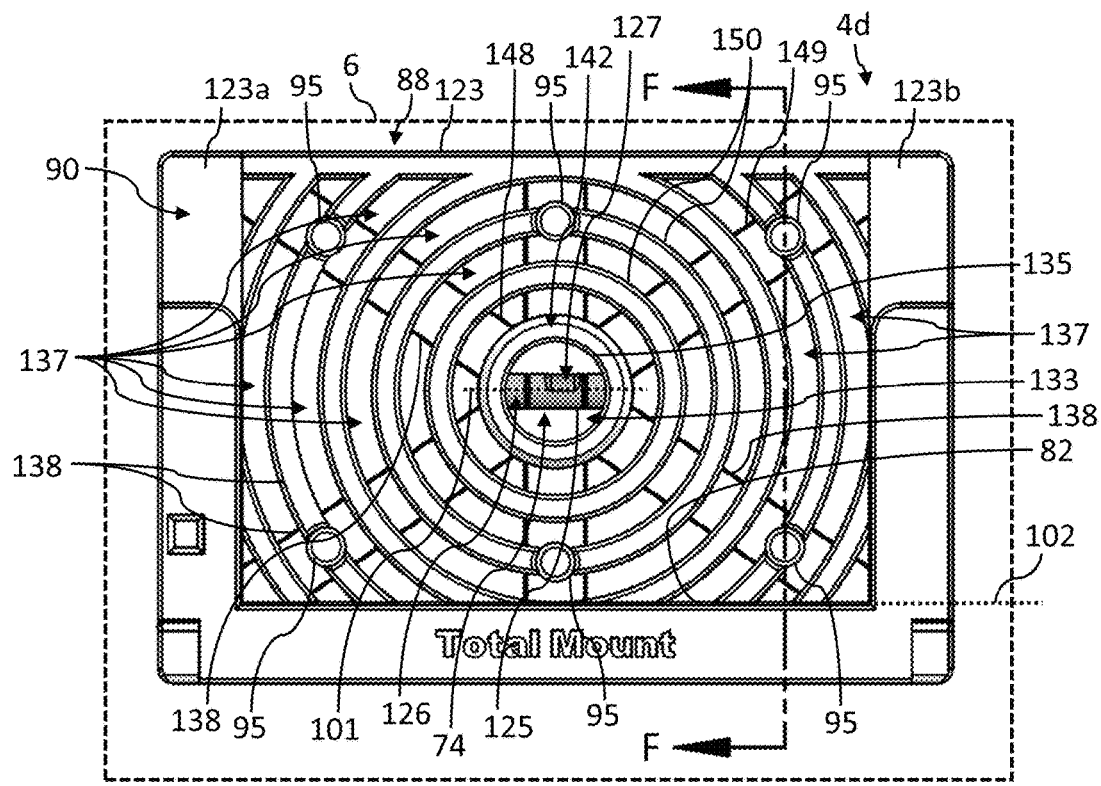
FIG. 37 illustrates a front view of the mounting system illustrated in FIG. 25, according to some embodiments.

Arrow 79 indicates that the dock 2*e* can slide downward into the shelf system 4*d*. Arrow 80 indicates that the Nintendo Switch 2*d* can slide down into the dock 2*e* to electrically and mechanically couple the Nintendo Switch 2*d* to the dock 2*e* (while the shelf system 4*d* mechanically couples the Nintendo Switch 2*d* and the dock 2*e* to the wall). FIG. 26 illustrates a perspective view of the shelf system 4*d* holding the electronic devices 2*d*, 2*e*. FIG. 37 illustrates the shelf system 4*d* coupled to the wall 6.

Referring now to FIG. 25, the shelf system 4*d* can include upwardly oriented hooks 81 that protrude from an outward face of the shelf system (and/or that protrude from an outward surface of the shelf 82). As indicated by arrows 84, wrist straps 85 can be hung on the hooks 81 to couple the controllers 86 (e.g., gaming controllers, remote controls) to the shelf system 4*d*. The hooks 81 can protrude outward away from the backside 89 of the base 88 and upward away from the floor. As indicated by arrow 94, a screw 8 can be inserted through each screw hole 95 to couple the shelf system 4*d* to the wall 6.

FIGS. 27-35 illustrate various views of the shelf system 4*d*. Many features are not labeled in FIGS. 27-35 to avoid obscuring the design details of the embodiment illustrated in FIGS. 27-35.

In some embodiments, a shelf system 4*d* is configured to couple an electronic device 2*d*, 2*e* to a wall 6. Shelf systems 4*d* can comprise a base 88 having a backside 89 configured to face inward towards the wall 6 and a frontside 90 configured to face outward away from the wall 6; a shelf 82 coupled to the base 88, wherein the shelf 82 protrudes outward from the base 88 such that the shelf 82 is configured to be oriented within 15 degrees of perpendicular to the wall 6; a first sidewall 91 coupled to a left half of the base 88 and a second sidewall 92 coupled to a right half of the base 88; and/or a level 74 coupled to the base 88, wherein the level 74 is configured to indicate a horizontal condition of the shelf 82. As used herein, the "horizontal condition" of the shelf might be truly horizontal or might vary by an angle relative to true horizontal. As used herein, "true horizontal" is perfectly horizontal.

Figure 38:
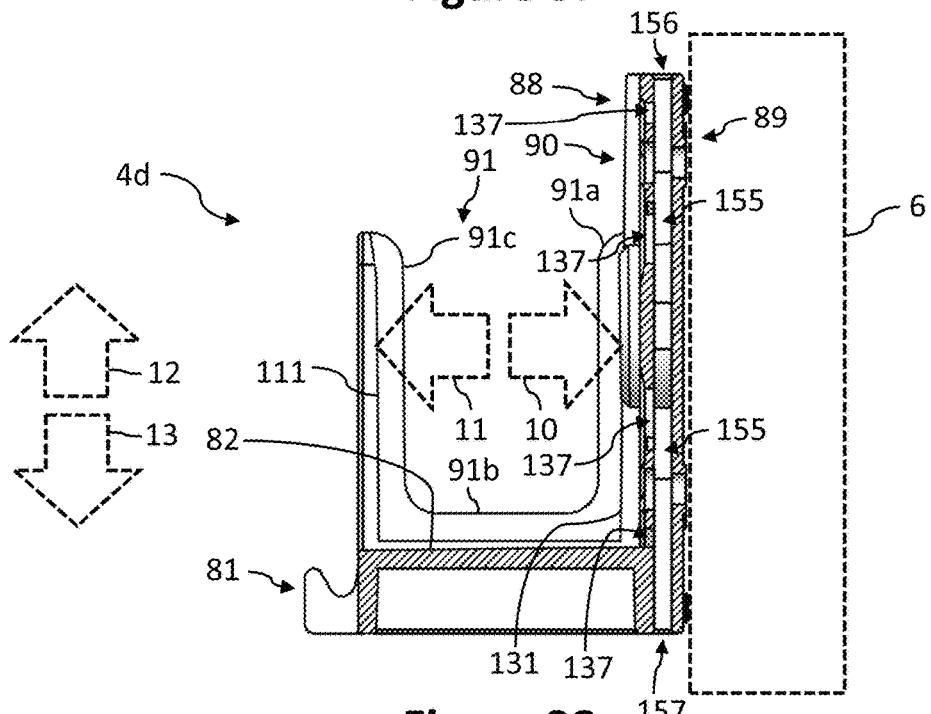
FIG. 38 illustrates a cross-sectional view of the mounting system illustrated in FIG. 25, according to some embodiments.

As labeled in FIG. 38, a sidewall 91 can have multiple portions 91*a*-*c* and can include holes and cutouts. Many different kinds of levels 74, 74*b*, 74*c* can be used with the embodiments shown in FIGS. 1-40.

Referring now to FIG. 37, a level 74 comprises a first horizontal orientation 101 and the shelf 82 comprises a second horizontal orientation 102. The first horizontal orientation 101 and the second horizontal orientation 102 are not necessarily equal to true horizontal (and thus, might not be perfectly horizontal). The some embodiments, the second horizontal orientation 102 is within 5 degrees and/or within 10 degrees of the first horizontal orientation 101.

Referring now to FIGS. 26 and 37, the shelf system 4*d* can comprise the electronic device 2*d*, 2*e* located at least partially between the first sidewall 91, the second sidewall 92, and the shelf 82 such that the shelf 82 is configured to vertically support the electronic device 2*d*, 2*e* in a third horizontal orientation 103 that is within five degrees of the first horizontal orientation 101. As used herein, "vertically support" means to hold against the downward force of gravity.

The shelf system 4*d* can comprise a first retention lip 111 coupled to the first sidewall 91 and a second retention lip 112 coupled to the second sidewall 92. A central axis of the level 74 is oriented between the first sidewall 91 and the second sidewall 92 such that the electronic device 2*d*, 2*e* is prevented from moving left by the first sidewall 91, right by the second sidewall 92, outward by the first and second retention lips 111, 112, and downward by the shelf 82. The shelf 82 can couple the first sidewall 91 to the second sidewall 92. The first sidewall 91 and the second sidewall 92 can be oriented within five degrees of perpendicular to a central axis of the level 74.

In several embodiments, the shelf 82 comprises a first vertical protrusion 121 coupled to a left half of an outward half of the shelf 82, and the shelf 82 comprises a second vertical protrusion 122 coupled a right half of the outward half. The first vertical protrusion 121 and the second vertical protrusion 122 can be oriented within ten degrees of perpendicular to a central axis of the level 74 such that the electronic device 2*d*, 2*e* is located inward relative to the first and second vertical protrusions 121, 122 and the electronic device 2*d*, 2*e* is located outward relative to the level 74.

In some embodiments, the base 88 comprises an outward-facing wall 123 that couples the first sidewall 91 and the second sidewall 92 to the backside 89, and the level 74 comprises a central axis that is located inward relative to the outward-facing wall 123. The outward-facing wall 123 can have multiple portions 123*a*, 123*b* (labeled in FIG. 37). The first sidewall 91, the second sidewall 92, and the shelf 82 can be located outward relative to the central axis of the level 74. The shelf system 4*d* can be configured to secure at least a portion of the electronic device 2*d*, 2*e* between the outward-facing wall 123, the first sidewall 91, the second sidewall 92, and the shelf 82.

In some embodiments, the shelf system 4*d* does not comprise the electronic device 2*d*, 2*e*. In some embodiments, the shelf system 4*d* comprises the electronic device 2*d*, 2*e*.

The first sidewall 91 can couple a first retention lip 111 to the base 88. The retention lips 111, 112 can have at least one inward facing surface configured to block the electronic device 2*d*, 2*e* from moving outward off the shelf 82. The second sidewall 92 can couple a second retention lip 112 to the base 88. A central axis of the level 74 can be oriented from the left half of the base 88 (which can be coupled to the first sidewall 91) to the right half of the base 88 (which can be coupled to the second sidewall 92) such that at least a portion, at least a majority, or all of the electronic device 2*d*, 2e is located between the level 74, the first sidewall 91, the second sidewall 92, the first retention lip 111, the second retention lip 112, and the shelf 82.

The level 74 illustrated in FIG. 37 comprises a hollow tube 125 that is at least partially filled with a liquid 126 and a gas bubble 127. The liquid 126 can be water, alcohol, or any suitable liquid with coloring. The interior of the tube 125 can have a slight upward curve to encourage the bubble 127 to rest in a middle portion of the tube 125 (directly between the two ends of the tube 125). The tube 125 can comprise a central axis located farther inward than a first intersection 131 (e.g., an outermost intersection) between the first sidewall 91 and the base 88. The central axis can be located farther inward than a second intersection 132 between the second sidewall 92 and the base 88. (The first intersection 131 and the second intersection 132 are labeled in FIG. 25.) The level 74 can be at least partially recessed within a hole 133 of the base 88 to prevent the level 74 from interfering with inserting the electronic device 2d, 2e onto the shelf 82.

In FIG. 38, Arrow 10 indicates an inward direction (i.e., a direction towards the wall 6), and Arrow 11 indicates an outward direction (i.e., a direction away from the wall 6). Arrow 12 indicates an upward direction. Arrow 13 indicates a downward direction.

In several embodiments, a level is supported by venting features. The base 88 can comprise a first hole 133 having a perimeter 135. The level 74 can be located at least partially in the first hole 133. The level 74 can be at least partially supported by the perimeter 135 of the first hole 133. The base 88 can comprise ventilation channels 137 formed by intersecting protrusions 138. The intersecting protrusions 138 can couple the first hole 133 to the left half and the right half of the base 88. To avoid obscuring features in the figures, the ventilation channels 137 and protrusions 138 are not labeled in many figures, and only some of the ventilation channels 137 and protrusions 138 are labeled in FIG. 37.

Figure 36:
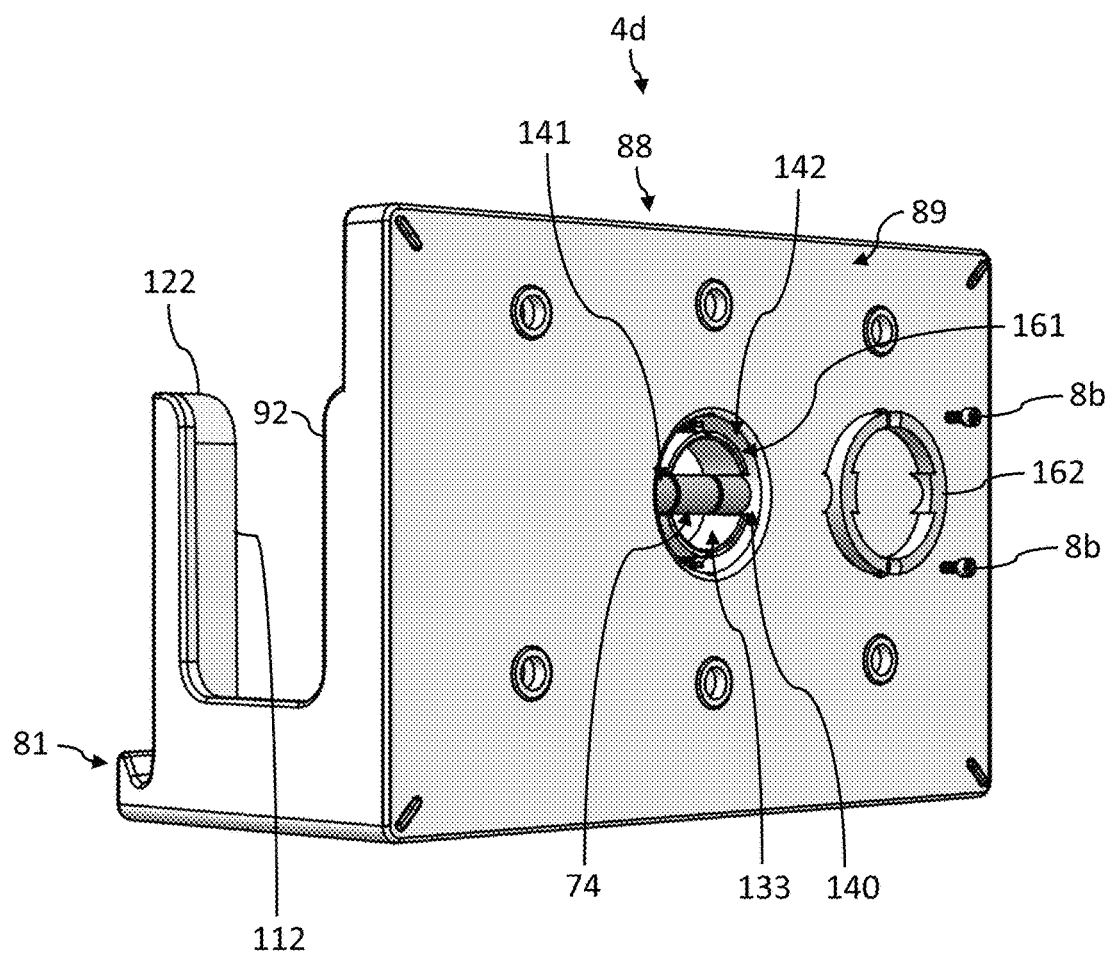
FIG. 36 illustrates a perspective view of the mounting system illustrated in FIG. 25, according to some embodiments.

Referring now to FIGS. 36 and 37, the level 74 comprises a left end portion 140 and a right end portion 141 that are secured within a housing 142. (FIG. 36 shows the backside 89 of the shelf system 4d, so the left side of FIG. 36 is actually the right side of the shelf system 4d.)

The base 88 can comprise ventilation channels 137 formed by protrusions 138 that couple the housing 142 to the base 88. In some embodiments, at least one of the protrusions 138 comprises a hole 95 configured to enable a first screw to pass through the protrusion to screw the base 88 to the wall 6. The housing 142 can comprise a second hole 133 located between the left end portion 140 and the right end portion 141 of the level 74 such that a middle portion of the level 74 is visible through the second hole 133 when the base 88 is coupled to the wall 6.

In some embodiments, the level 74 comprises a left end portion 140 and a right end portion 141 that are secured within a housing 142. A first protrusion 148 can couple the housing 142 to the left half of the base 88. A second protrusion 149 can couple the housing 142 to the right half of the base 88. Intersecting braces 150 can couple the first protrusion 148 to the second protrusion 149.

FIG. 38 illustrates a cross-sectional view taken along line F-F from FIG. 37. A ventilation channel 155 is located between the frontside 90 of the base 88 and the backside 89 of the base 88. The ventilation channel 155 fluidly couples an opening 156 (labeled in FIG. 34) in the top end portion of the base 88 to an opening 157 (labeled in FIG. 35) in the bottom end portion of the base 88.

In several embodiments, the base 88 comprises a ventilation channel 155 from a bottom end portion of the base 88 to a top end portion of the base 88. The ventilation channel 155 can be a hollow portion of the base 88. In some embodiments, the ventilation channel 155 is formed when the base 88 is coupled to the wall 6. For example, a wall 6 of the base 88 and the wall 6 of the building can form a hollow area fluidly coupled to openings in the top and bottom of the system.

In some embodiments, the base 88 further comprises at least two holes 137 formed, at least in part, by the first protrusion 148, the second protrusion 149, and the intersecting brace 150. The holes 137 can be fluidly coupled with the ventilation channel 155 such that the holes 137 are configured to permit airflow from an area (that is configured to hold the electronic device 2d, 2e) between the first sidewall 91 and the second sidewall 92 into the ventilation channel 155.

FIG. 36 illustrates a perspective view of the backside of the shelf system 4d. In FIG. 36 a ring 162 configured to hold the level 74 inside the housing 142 has been removed to show a channel 161 that wraps around the level 74. The level 74 can be inserted into the housing 142 and then the ring can be coupled to the housing 142 by small screws 8b.

Figure 33:
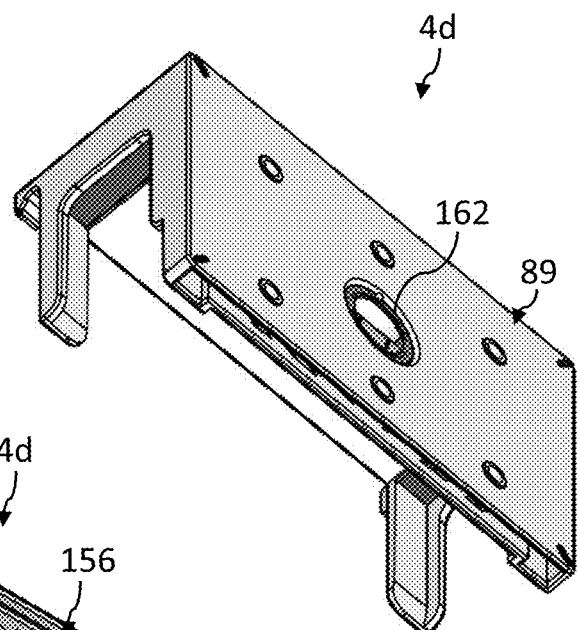
FIGS. 33-35 illustrate perspective views of the mounting system illustrated in FIG. 25, according to some embodiments.
Figure 34:
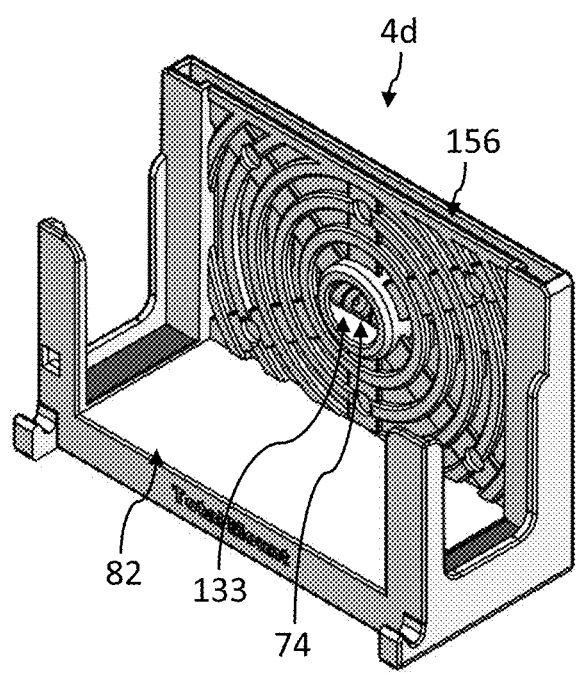
Figure 35:
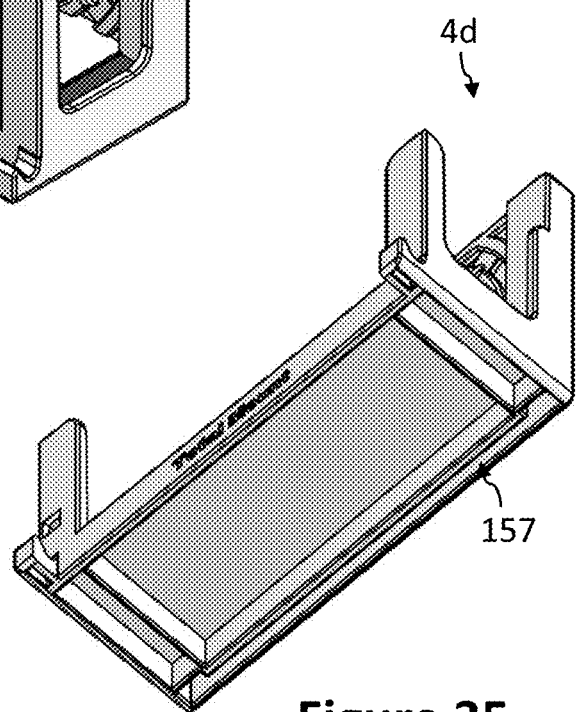

In several embodiments, the level 74 comprises a left end portion 140 and a right end portion 141 that are secured within a housing 142. The housing 142 can comprise a hole 133 located between the left end portion 140 and the right end portion 141 of the level 74 such that a middle portion of the level 74 is visible through the hole 133. The housing 142 can comprise a channel 161 that faces inward and wraps around the level 74. The shelf system 4d can comprise a ring 162 located at least partially inside the channel 161 such that the level 74 is secured between the housing 142 and the ring 162 (e.g., as illustrated in FIG. 33).

Many types of levels can be used with the embodiments described herein. Any of the levels described herein can be used with any of the embodiments described herein.

In some embodiments, the level 74 comprises a hollow tube 125 at least partially filled with a liquid 126 and a gas bubble 127. The gas bubble 127 can be configured to move inside the hollow tube 125 to indicate the horizontal condition of the shelf 82. For example, if the bubble 127 is located to the right of the center of the tube 125, then the right side of the tube 125 may be higher than the left side of the tube 125.

Figure 39:
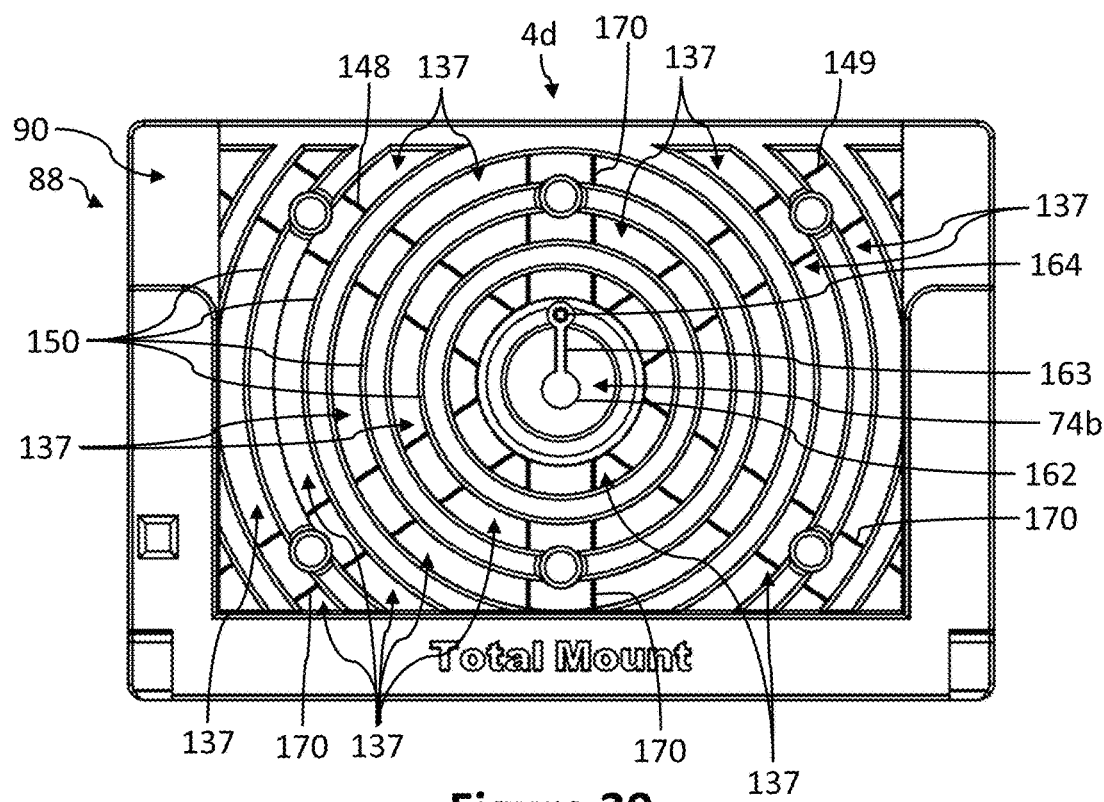
FIGS. 39 and 40 illustrate front views of the mounting system illustrated in FIG. 25 with various levels, according to some embodiments.
Figure 40:
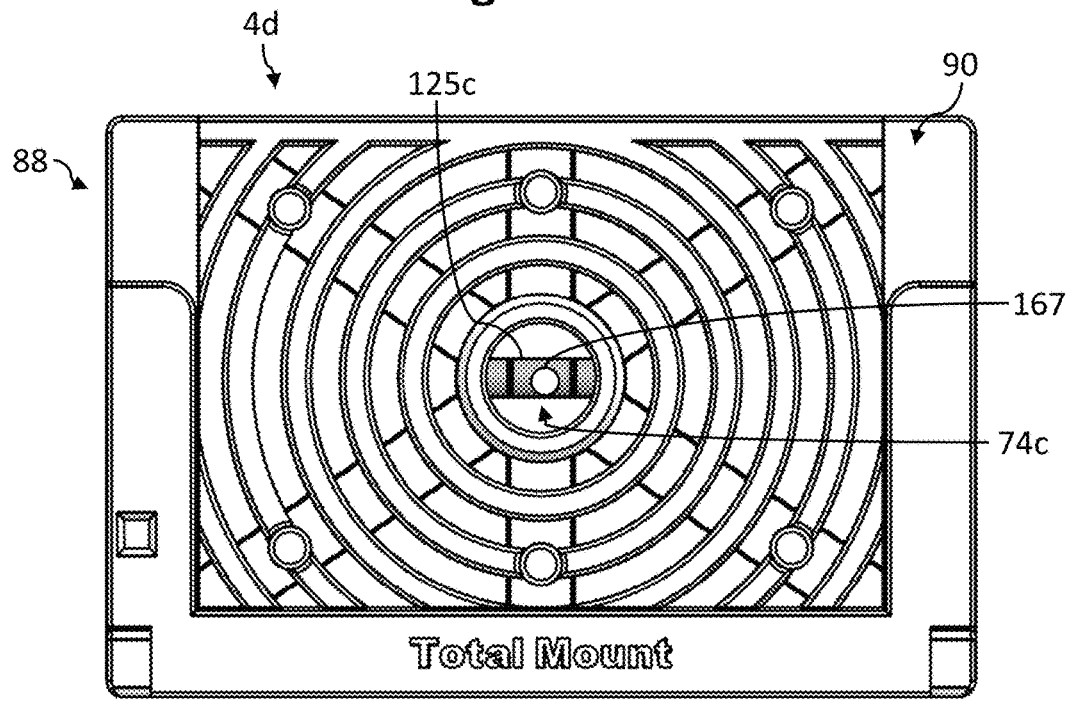

FIG. 39 illustrates a shelf system 4d with a level 74b that comprises a weight 162 rotatably coupled to the base 88 by an attachment point 164 (which can be a pivot such as a pin joint). The weight 162 can be configured to hang below the attachment point 164 and rotate relative to the attachment point 164 to indicate the horizontal condition of the shelf 82. The level 74b can be a plumb bob (e.g., a weight suspended by a string). The level 74b can be an arm 163 coupled to the base 88 by a pivot such that the arm points downward (as moved by gravity). To avoid obscuring features, only some of the ventilation channels 137 are labeled in FIG. 39 (and are not labeled in some figures).

In several embodiments, the level 74c comprises a hollow tube 125c and a weight (e.g., a ball) located inside the tube 125. In some embodiments, the hollow tube 125c is filled with a liquid such as water, oil, or alcohol. The weight 167 (e.g., a ball) can be configured to move inside the hollow tube 125c to indicate the horizontal condition of the shelf 82. For example, if the weight 167 is located to the right of the center of the tube 125, then the right side of the tube 125 may be lower than the left side of the tube 125.

As shown in FIGS. 37 and 39, protrusions 148, 149, 170 can protrude from a central housing 142 through a ventilation area comprising holes 137 configured to permit airflow from openings in top portions and bottom portions of the shelf system 4d. Curved intersection braces 150 can couple at least some of the protrusions 148, 149, 170.

Interpretation

"Electronic device" can comprise any electronic device, such as a streaming media player, a gaming console, a cable box (for providing digital cable television content from a cable provider to a television), and any other electronic device.

The term "wall" is used broadly. Wall can comprise any surface located along a television, such as a backside surface of a television. Wall can also comprise any wall associated with a building (e.g., a home, an office building, a school, etc.), such as an interior wall and/or an exterior wall.

None of the steps described herein is essential or indispensable. Any of the steps can be adjusted or modified. Other or additional steps can be used. Any portion of any of the steps, processes, structures, and/or devices disclosed or illustrated in one embodiment, flowchart, or example in this specification can be combined or used with or instead of any other portion of any of the steps, processes, structures, and/or devices disclosed or illustrated in a different embodiment, flowchart, or example. The embodiments and examples provided herein are not intended to be discrete and separate from each other.

The section headings and subheadings provided herein are nonlimiting. The section headings and subheadings do not represent or limit the full scope of the embodiments described in the sections to which the headings and subheadings pertain. For example, a section titled "Topic 1" may include embodiments that do not pertain to Topic 1 and embodiments described in other sections may apply to and be combined with embodiments described within the "Topic 1" section.

Some of the devices, systems, embodiments, and processes use computers. Each of the routines, processes, methods, and algorithms described in the preceding sections may be embodied in, and fully or partially automated by, code modules executed by one or more computers, computer processors, or machines configured to execute computer instructions. The code modules may be stored on any type of non-transitory computer-readable storage medium or tangible computer storage device, such as hard drives, solid state memory, flash memory, optical disc, and/or the like. The processes and algorithms may be implemented partially or wholly in application-specific circuitry. The results of the disclosed processes and process steps may be stored, persistently or otherwise, in any type of non-transitory computer storage such as, e.g., volatile or non-volatile storage.

The various features and processes described above may be used independently of one another, or may be combined in various ways. All possible combinations and subcombinations are intended to fall within the scope of this disclosure. In addition, certain method, event, state, or process blocks may be omitted in some implementations. The methods, steps, and processes described herein are also not limited to any particular sequence, and the blocks, steps, or states relating thereto can be performed in other sequences that are appropriate. For example, described tasks or events may be performed in an order other than the order specifically disclosed. Multiple steps may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require at least one of X, at least one of Y, and at least one of Z to each be present.

The term "and/or" means that "and" applies to some embodiments and "or" applies to some embodiments. Thus, A, B, and/or C can be replaced with A, B, and C written in one sentence and A, B, or C written in another sentence. A, B, and/or C means that some embodiments can include A and B, some embodiments can include A and C, some embodiments can include B and C, some embodiments can only include A, some embodiments can include only B, some embodiments can include only C, and some embodiments can include A, B, and C. The term "and/or" is used to avoid unnecessary redundancy.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions, and changes in the form of the methods and systems described herein may be made without departing from the spirit of the inventions disclosed herein.

The following is claimed:

1. A shelf system configured to couple an electronic device to a wall, the shelf system comprising:
   a base having a backside configured to face inward towards the wall and a frontside configured to face outward away from the wall;
   a shelf coupled to the base, wherein the shelf protrudes outward from the base such that the shelf is configured to be oriented within 15 degrees of perpendicular to the wall;
   a first sidewall coupled to a left half of the base and a second sidewall coupled to a right half of the base; and
   a level coupled to the base, wherein the level is configured to indicate a horizontal condition of the shelf, wherein the level comprises a left end portion and a right end portion that are secured within a housing, the housing comprises a hole located between the left end portion and the right end portion of the level such that a middle portion of the level is visible through the hole, the housing comprises a channel that faces inward and wraps around the level, and the shelf system further comprises a ring located at least partially inside the channel such that the level is secured between the housing and the ring.

2. The shelf system of claim 1, wherein the level comprises a first horizontal orientation and the shelf comprises a second horizontal orientation that is within five degrees of the first horizontal orientation, the shelf system further comprising the electronic device located at least partially between the first sidewall, the second sidewall, and the shelf such that the shelf is configured to vertically support the electronic device in a third horizontal orientation that is within five degrees of the first horizontal orientation.

3. The shelf system of claim 1, further comprising a first retention lip coupled to the first sidewall and a second retention lip coupled to the second sidewall, wherein a central axis of the level is oriented between the first and second sidewalls such that the shelf system is configured to prevent the electronic device from moving left by the first sidewall, right by the second sidewall, outward by the first and second retention lips, and downward by the shelf.

4. The shelf system of claim 1, wherein the shelf couples the first sidewall to the second sidewall.

5. The shelf system of claim 1, wherein the first and second sidewalls are oriented within five degrees of perpendicular to a central axis of the level.

6. The shelf system of claim 1, wherein the shelf comprises a first vertical protrusion coupled to a left half of an outward half of the shelf, and the shelf comprises a second vertical protrusion coupled a right half of the outward half, wherein the first and second vertical protrusions are oriented within ten degrees of perpendicular to a central axis of the level such that the shelf system is configured to hold the electronic device inward relative to the first and second vertical protrusions and the shelf system is configured to hold the electronic device outward relative to the level.

7. The shelf system of claim 1, wherein the base comprises an outward-facing wall that couples the first and second sidewalls to the backside, and the level comprises a central axis that is located inward relative to the outward-facing wall,
wherein the first sidewall, the second sidewall, and the shelf are located outward relative to the central axis of the level, and the shelf system is configured to secure at least a portion of the electronic device between the outward-facing wall, the first sidewall, the second sidewall, and the shelf.

8. The shelf system of claim 1, further comprising the electronic device, wherein the first sidewall couples a first retention lip to the base, the second sidewall couples a second retention lip to the base, and the electronic device is located at least partially between the level, the first sidewall, the second sidewall, the first retention lip, the second retention lip, and the shelf.

9. The shelf system of claim 1, wherein the level comprises a hollow tube at least partially filled with a liquid and a gas bubble, wherein the tube comprises a central axis located farther inward than a first intersection between the first sidewall and the base, and the central axis is located farther inward than a second intersection between the second sidewall and the base.

10. The shelf system of claim 9, wherein the level is at least partially recessed within the hole to prevent the level from interfering with inserting the electronic device onto the shelf.

11. The shelf system of claim 1, wherein the hole comprises a perimeter, the level is located at least partially in the hole, and the level is at least partially supported by the perimeter of the hole, wherein the base comprises ventilation channels formed by intersecting protrusions, and the intersecting protrusions couple the hole to the left half and the right half of the base.

12. The shelf system of claim 1, wherein the base comprises ventilation channels formed by protrusions that couple the housing to the base.

13. The shelf system of claim 1, wherein the level comprises a hollow tube at least partially filled with a liquid and a gas bubble, wherein the gas bubble is configured to move inside the hollow tube to indicate the horizontal condition of the shelf.

14. The shelf system of claim 1, wherein the level comprises a hollow tube and a ball located inside the tube, wherein the ball is configured to move inside the hollow tube to indicate the horizontal condition of the shelf.

15. The shelf system of claim 1, wherein the level comprises a weight rotatably coupled to the base by an attachment point, wherein the weight is configured to hang below the attachment point and rotate relative to the attachment point to indicate the horizontal condition of the shelf.

16. A shelf system configured to couple an electronic device to a wall, the shelf system comprising:
a base having a backside configured to face inward towards the wall and a frontside configured to face outward away from the wall;
a shelf coupled to the base, wherein the shelf protrudes outward from the base such that the shelf is configured to be oriented within 15 degrees of perpendicular to the wall;
a first sidewall coupled to the base and a second sidewall coupled to the base; and
a first protrusion, a second protrusion, and an intersecting brace that couples the first protrusion to the second protrusion, wherein the base comprises a ventilation channel from a bottom end portion of the base to a top end portion of the base, the base further comprises at least two holes formed, at least in part, by the first protrusion, the second protrusion, and the intersecting brace, wherein the holes are fluidly coupled with the ventilation channel such that the holes are configured to permit airflow from an area between the first and second sidewalls into the ventilation channel.

17. The shelf system of claim 16, wherein the first protrusion comprises a screw entrance hole configured to enable a first screw to pass through the first protrusion to screw the base to the wall.

18. The shelf system of claim 16, further comprising a level coupled to the base, wherein the level is configured to indicate a horizontal condition of the shelf, wherein the level comprises a first horizontal orientation and the shelf comprises a second horizontal orientation that is within five degrees of the first horizontal orientation, the shelf system further comprising the electronic device located at least partially between the first sidewall, the second sidewall, and the shelf such that the shelf is configured to vertically support the electronic device in a third horizontal orientation that is within five degrees of the first horizontal orientation.

19. The shelf system of claim 18, further comprising a first retention lip coupled to the first sidewall and a second retention lip coupled to the second sidewall, wherein a central axis of the level is oriented between the first and second sidewalls such that the electronic device is prevented from moving left by the first sidewall, right by the second sidewall, outward by the first and second retention lips, and downward by the shelf.

20. The shelf system of claim 16, further comprising a level coupled to the base, wherein the level is configured to indicate a horizontal condition of the shelf, wherein the base comprises an outward-facing wall that couples the first and second sidewalls to the backside, and the level comprises a central axis that is located inward relative to the outward-facing wall,
    wherein the first sidewall, the second sidewall, and the shelf are located outward relative to the central axis of the level, and the shelf system is configured to secure at least a portion of the electronic device between the outward-facing wall, the first sidewall, the second sidewall, and the shelf.

\* \* \* \* \*